(12) United States Patent
Coolbaugh et al.

(10) Patent No.: US 11,635,568 B2
(45) Date of Patent: Apr. 25, 2023

(54) PHOTONICS LIGHT SIGNAL TRANSMISSION

(71) Applicant: The Research Foundation for The State University of New York, Albany, NY (US)

(72) Inventors: Douglas Coolbaugh, Albany, NY (US); Gerald L. Leake, Jr., Albany, NY (US)

(73) Assignee: THE RESEARCH FOUNDATION FOR THE STATE UNIVERSITY OF NEW YORK, Albany, NY (US)

( * ) Notice: Subject to any disclaimer, the term of this patent is extended or adjusted under 35 U.S.C. 154(b) by 0 days.

(21) Appl. No.: 17/809,580

(22) Filed: Jun. 29, 2022

(65) Prior Publication Data
US 2022/0350076 A1    Nov. 3, 2022

Related U.S. Application Data

(63) Continuation of application No. 16/998,736, filed on Aug. 20, 2020, now Pat. No. 11,378,739, which is a continuation of application No. 16/372,763, filed on Apr. 2, 2019, now Pat. No. 10,816,724.

(60) Provisional application No. 62/653,232, filed on Apr. 5, 2018.

(51) Int. Cl.
| | |
|---|---|
| G02B 6/122 | (2006.01) |
| H01L 21/762 | (2006.01) |
| H01L 21/48 | (2006.01) |
| G02B 6/136 | (2006.01) |
| G02B 6/12 | (2006.01) |

(52) U.S. Cl.
CPC ............. *G02B 6/122* (2013.01); *G02B 6/136* (2013.01); *H01L 21/486* (2013.01); *H01L 21/76202* (2013.01); *G02B 2006/12061* (2013.01); *H01L 21/4857* (2013.01)

(58) Field of Classification Search
None
See application file for complete search history.

(56) References Cited

U.S. PATENT DOCUMENTS

| | | | |
|---|---|---|---|
| 5,841,931 | A | 11/1998 | Foresi et al. |
| 6,108,464 | A | 8/2000 | Foresi et al. |
| 6,621,972 | B2 | 9/2003 | Kimerling et al. |

(Continued)

FOREIGN PATENT DOCUMENTS

| | | |
|---|---|---|
| JP | 2004/253780 A | 9/2004 |
| JP | 2009/182000 A | 8/2009 |

(Continued)

OTHER PUBLICATIONS

Notification of Transmittal of the International Search Report and The Written Opinion of tire International Searching Authority, International Application No. PCT/US2019/025503, filed Apr. 3, 2019, dated Jul. 12, 2019.

(Continued)

*Primary Examiner* — Jerry Rahll
(74) *Attorney, Agent, or Firm* — Heslin Rothenberg Farley & Mesiti PC

(57) ABSTRACT

There is set forth herein a photonics device. The photonics device can comprise a substrate, a conductive material formation, a dielectric stack, and a barrier layer. The photonics device can transmit a light signal.

20 Claims, 8 Drawing Sheets

(56) References Cited

U.S. PATENT DOCUMENTS

| | | |
|---|---|---|
| 6,631,225 B2 | 10/2003 | Lee et al. |
| 6,635,110 B1 | 10/2003 | Luan et al. |
| 6,690,871 B2 | 2/2004 | Lee et al. |
| 6,697,551 B2 | 2/2004 | Lee et al. |
| 6,812,495 B2 | 11/2004 | Wada et al. |
| 6,850,683 B2 | 2/2005 | Lee et al. |
| 6,879,014 B2 | 4/2005 | Wagner et al. |
| 6,884,636 B2 | 4/2005 | Fiorini et al. |
| 6,887,773 B2 | 5/2005 | Gunn, III et al. |
| 6,927,392 B2 | 8/2005 | Liddiard |
| 6,946,318 B2 | 9/2005 | Wada et al. |
| 7,008,813 B1 | 3/2006 | Lee et al. |
| 7,043,120 B2 | 5/2006 | Wada et al. |
| 7,075,081 B2 | 7/2006 | Fiorini et al. |
| 7,095,010 B2 | 8/2006 | Scherer et al. |
| 7,103,245 B2 | 9/2006 | Lee et al. |
| 7,123,805 B2 | 10/2006 | Sparacin et al. |
| 7,186,611 B2 | 3/2007 | Hsu et al. |
| 7,190,871 B2 | 3/2007 | Lock et al. |
| 7,194,166 B1 | 3/2007 | Gunn, III et al. |
| 7,251,386 B1 | 7/2007 | Dickinson et al. |
| 7,259,031 B1 | 8/2007 | Dickinson et al. |
| 7,262,117 B1 | 8/2007 | Gunn, III et al. |
| 7,266,263 B2 | 9/2007 | Ahn et al. |
| 7,279,682 B2 | 10/2007 | Ouvrier-Buffet et al. |
| 7,305,157 B2 | 12/2007 | Ahn et al. |
| 7,317,242 B2 | 1/2008 | Takizawa |
| 7,320,896 B2 | 1/2008 | Fiorini et al. |
| 7,321,713 B2 | 1/2008 | Akiyama et al. |
| 7,340,709 B1 | 3/2008 | Masini et al. |
| 7,358,527 B1 | 4/2008 | Masini et al. |
| 7,389,029 B2 | 6/2008 | Rahman et al. |
| 7,397,101 B1 | 7/2008 | Masini et al. |
| 7,424,181 B2 | 9/2008 | Haus et al. |
| 7,453,129 B2 | 11/2008 | King et al. |
| 7,453,132 B1 | 11/2008 | Gunn, III et al. |
| 7,459,686 B2 | 12/2008 | Syllaios et al. |
| 7,480,430 B2 | 1/2009 | Saini et al. |
| 7,508,050 B1 | 3/2009 | Pei et al. |
| 7,565,046 B2 | 7/2009 | Feng et al. |
| 7,613,369 B2 | 11/2009 | Witzens et al. |
| 7,616,904 B1 | 11/2009 | Gunn, III et al. |
| 7,651,880 B2 | 1/2010 | Tweet et al. |
| 7,659,627 B2 | 2/2010 | Miyachi et al. |
| 7,700,975 B2 | 4/2010 | Rakshit et al. |
| 7,723,206 B2 | 5/2010 | Miyachi et al. |
| 7,723,754 B2 | 5/2010 | Wada et al. |
| 7,736,734 B2 | 6/2010 | Carothers et al. |
| 7,737,534 B2 | 6/2010 | McLaughlin et al. |
| 7,754,540 B2 | 7/2010 | Vashchenko et al. |
| 7,767,499 B2 | 8/2010 | Herner |
| 7,773,836 B2 | 8/2010 | De Dobbelaere |
| 7,790,495 B2 | 9/2010 | Assefa et al. |
| 7,801,406 B2 | 9/2010 | Pan et al. |
| 7,812,404 B2 | 10/2010 | Herner et al. |
| 7,816,767 B2 | 10/2010 | Pei et al. |
| 7,831,123 B2 | 11/2010 | Sparacin et al. |
| 7,961,992 B2 | 1/2011 | De Dobbelaere et al. |
| 7,902,620 B2 | 3/2011 | Assefa et al. |
| 7,906,825 B2 | 3/2011 | Tweet et al. |
| 7,916,377 B2 | 3/2011 | Witzens et al. |
| 7,943,471 B1 | 5/2011 | Bauer et al. |
| 7,973,377 B2 | 7/2011 | King et al. |
| 7,994,066 B1 | 8/2011 | Capellini et al. |
| 7,999,344 B2 | 8/2011 | Assefa et al. |
| 8,030,668 B2 | 10/2011 | Hisamoto et al. |
| 8,121,447 B2 | 2/2012 | De Dobbelaere et al. |
| 8,165,431 B2 | 4/2012 | De Dobbelaere et al. |
| 8,168,939 B2 | 5/2012 | Mack et al. |
| 8,178,382 B2 | 5/2012 | Assefa et al. |
| 8,188,512 B2 | 5/2012 | Kim et al. |
| 8,227,787 B2 | 7/2012 | Kumar et al. |
| 8,238,014 B2 | 8/2012 | Kucharski et al. |
| 8,289,067 B2 | 10/2012 | Kucharski et al. |
| 8,304,272 B2 | 11/2012 | Assefa et al. |
| 8,343,792 B2 | 1/2013 | Carothers et al. |
| 8,354,282 B2 | 1/2013 | Stern |
| 8,358,940 B2 | 1/2013 | Kucharski et al. |
| 8,399,949 B2 | 3/2013 | Meade |
| 8,440,989 B2 | 5/2013 | Mack et al. |
| 8,455,292 B2 | 6/2013 | Assefa et al. |
| 8,471,639 B2 | 6/2013 | Welch |
| 8,577,191 B2 | 11/2013 | De Dobbelaere et al. |
| 8,592,745 B2 | 11/2013 | Masini et al. |
| 8,604,866 B2 | 12/2013 | Kucharski et al. |
| 8,614,116 B2 | 12/2013 | Assefa et al. |
| 8,625,935 B2 | 1/2014 | Mekis et al. |
| 8,626,002 B2 | 1/2014 | Kucharski et al. |
| 8,633,067 B2 | 1/2014 | Assefa et al. |
| 8,649,639 B2 | 2/2014 | Mekis et al. |
| 8,664,739 B2 | 3/2014 | King et al. |
| 8,665,508 B2 | 3/2014 | Kucharski et al. |
| RE44,829 E | 4/2014 | De et al. |
| 8,698,271 B2 | 4/2014 | Suh et al. |
| 8,742,398 B2 | 6/2014 | Klem et al. |
| 8,754,711 B2 | 6/2014 | Welch |
| 8,772,704 B2 | 7/2014 | Mack et al. |
| 8,787,774 B2 | 7/2014 | Guckenberger |
| 8,798,476 B2 | 8/2014 | Gloeckner et al. |
| RE45,214 E | 10/2014 | De Dobbelaere et al. |
| RE45,215 E | 10/2014 | De Dobbelaere et al. |
| 8,877,616 B2 | 11/2014 | Pinguet et al. |
| 8,895,413 B2 | 11/2014 | Pinguet et al. |
| 8,923,664 B2 | 12/2014 | Mekis et al. |
| RE45,390 E | 2/2015 | De Dobbelaere et al. |
| 9,046,650 B2 | 6/2015 | Lin et al. |
| 9,053,980 B2 | 6/2015 | Pinguet et al. |
| 9,091,827 B2 | 7/2015 | Versiegers et al. |
| 9,110,221 B2 | 8/2015 | Agarwal et al. |
| 9,671,557 B1 | 6/2017 | Ding |
| 9,874,693 B2 | 1/2018 | Baiocco et al. |
| 2003/0215203 A1 | 11/2003 | Lock et al. |
| 2004/0183202 A1* | 9/2004 | Usami ............... H01L 23/53295 |
| | | 257/762 |
| 2005/0012040 A1 | 1/2005 | Fiorini et al. |
| 2005/0051705 A1 | 3/2005 | Yasailis |
| 2005/0101084 A1 | 5/2005 | Gilton |
| 2005/0205954 A1 | 9/2005 | King et al. |
| 2006/0110844 A1 | 5/2006 | Lee et al. |
| 2006/0194357 A1 | 8/2006 | Hsu et al. |
| 2006/0243973 A1 | 11/2006 | Gilton |
| 2006/0249753 A1 | 11/2006 | Herner |
| 2006/0250836 A1 | 11/2006 | Herner et al. |
| 2006/0250837 A1 | 11/2006 | Herner |
| 2006/0289764 A1 | 12/2006 | Fiorini et al. |
| 2007/0034978 A1 | 2/2007 | Pralle et al. |
| 2007/0099329 A1 | 5/2007 | Maa et al. |
| 2007/0104410 A1 | 5/2007 | Ahn et al. |
| 2007/0141744 A1 | 6/2007 | Lee et al. |
| 2007/0170536 A1 | 7/2007 | Hsu et al. |
| 2007/0190722 A1 | 8/2007 | Herner |
| 2007/0228414 A1 | 10/2007 | Kumar et al. |
| 2007/0246764 A1 | 10/2007 | Ilerner |
| 2007/0262296 A1 | 11/2007 | Bauer |
| 2008/0121805 A1 | 5/2008 | Tweet et al. |
| 2008/0157253 A1 | 7/2008 | Starikov et al. |
| 2008/0217651 A1 | 9/2008 | Liu et al. |
| 2008/0239787 A1 | 10/2008 | Herner |
| 2008/0311696 A1 | 12/2008 | Chee-Wee et al. |
| 2008/0316795 A1 | 12/2008 | Herner |
| 2008/0318397 A1 | 12/2008 | Herner |
| 2009/0032814 A1 | 2/2009 | Vashchenko et al. |
| 2009/0196631 A1 | 8/2009 | Daghighian et al. |
| 2010/0006961 A1 | 1/2010 | Yasaitis |
| 2010/0031992 A1 | 2/2010 | Hsu |
| 2010/0090110 A1 | 4/2010 | Tweet et al. |
| 2010/0102412 A1 | 4/2010 | Suh et al. |
| 2010/0133536 A1 | 6/2010 | Syllaios et al. |
| 2010/0133585 A1 | 6/2010 | Kim et al. |
| 2010/0151619 A1 | 6/2010 | Yasaitis |
| 2010/0213561 A1 | 8/2010 | Assefa et al. |
| 2010/0276776 A1 | 11/2010 | Lee et al. |
| 2010/0302836 A1 | 12/2010 | Herner |
| 2011/0012221 A1 | 1/2011 | Fukikata et al. |

(56) References Cited

U.S. PATENT DOCUMENTS

| | | |
|---|---|---|
| 2011/0027950 A1 | 2/2011 | Jones et al. |
| 2011/0156183 A1 | 6/2011 | Liu |
| 2011/0163404 A1 | 7/2011 | Lee et al. |
| 2011/0227116 A1 | 9/2011 | Saito et al. |
| 2012/0001283 A1 | 1/2012 | Assefa et al. |
| 2012/0025212 A1 | 2/2012 | Kouvctakis |
| 2012/0129302 A1 | 5/2012 | Assefa et al. |
| 2012/0187280 A1 | 7/2012 | Kerness et al. |
| 2012/0193636 A1 | 8/2012 | Stem |
| 2012/0288971 A1 | 11/2012 | Boagaerts et al. |
| 2012/0288992 A1 | 11/2012 | Assefa et al. |
| 2012/0299143 A1 | 11/2012 | Stern |
| 2013/0065349 A1 | 3/2013 | Assefa et al. |
| 2013/0154042 A1 | 6/2013 | Meade |
| 2013/0202005 A1 | 8/2013 | Dutt |
| 2013/0214160 A1 | 8/2013 | Cazaux et al. |
| 2013/0228886 A1 | 9/2013 | JangJian et al. |
| 2013/0284889 A1 | 10/2013 | Giffard et al. |
| 2013/0313579 A1 | 11/2013 | Kouvetakis et al. |
| 2013/0328145 A1 | 12/2013 | Liu et al. |
| 2014/0008750 A1 | 1/2014 | Feshali et al. |
| 2014/0027826 A1 | 1/2014 | Assefa et al. |
| 2014/0029892 A1 | 1/2014 | Pomerene et al. |
| 2014/0080269 A1 | 3/2014 | Assefa et al. |
| 2014/0124669 A1 | 5/2014 | Zheng et al. |
| 2014/0131733 A1 | 5/2014 | Meade |
| 2014/0134789 A1 | 5/2014 | Assefa et al. |
| 2014/0134790 A1 | 5/2014 | Assefa et al. |
| 2014/0159129 A1 | 6/2014 | Wang et al. |
| 2014/0175510 A1 | 6/2014 | Suh et al. |
| 2014/0203325 A1 | 7/2014 | Verma et al. |
| 2014/0209985 A1 | 7/2014 | Assefa et al. |
| 2014/0264400 A1 | 9/2014 | Lipson et al. |
| 2015/0125111 A1 | 5/2015 | Orcutt et al. |
| 2016/0197111 A1 | 7/2016 | Coolbaugh et al. |
| 2016/0223749 A1 | 8/2016 | Coolbaugh et al. |
| 2017/0139142 A1 | 5/2017 | Patel et al. |
| 2017/0299809 A1 | 10/2017 | Boeuf |
| 2017/0307824 A1 | 10/2017 | Usami et al. |
| 2018/0143374 A1 | 5/2018 | Coolbaugh et al. |
| 2018/0314003 A1 | 11/2018 | Coolbaugh et al. |
| 2019/0025513 A1 | 1/2019 | Coolbaugh et al. |

FOREIGN PATENT DOCUMENTS

| | | |
|---|---|---|
| JP | 2015/521799 A | 7/2015 |
| JP | 2017/009636 A | 1/2017 |
| JP | 2017/528910 A | 9/2017 |
| WO | WO2009/113961 | 9/2009 |
| WO | WO2009113961 A1 | 9/2009 |
| WO | WO2013086047 A1 | 6/2013 |

OTHER PUBLICATIONS

International Search Report, International Application No. PCT/US2019/025503, filed Apr. 3, 2019, dated Jul. 12, 2019.
Written Opinion of the International Searching Authority, International Application No. PCT/US2019/025503, filed Apr. 3, 2019, dated Jul. 12, 2019.
Search Report, Taiwan Application No. 108111965, filed Apr. 3, 2019, dated Feb. 17, 2020. (The Original Document and Full Text Translation).
Office Action, Taiwan Application No. 108111965, filed Apr. 3, 2019, dated Feb. 19, 2020. (The Original Document and Full Text Translation).
Office Action, Taiwan Application No. 108111965, filed Apr. 3, 2019, dated Oct. 21, 2020. (The Original Document and Full Text Translation).
Conunurtication pursuant to Article 94(3) EPC; European Patent Office Application No. 19720725.1; dated Jun. 20, 2022; 8 pages.
Notice of Reason of Refusal; Japan Patent Office; dated Jan. 4, 2023; Application No. 2020-553629; 11 pages. (submitted with copy of original document and full text English translation).

* cited by examiner

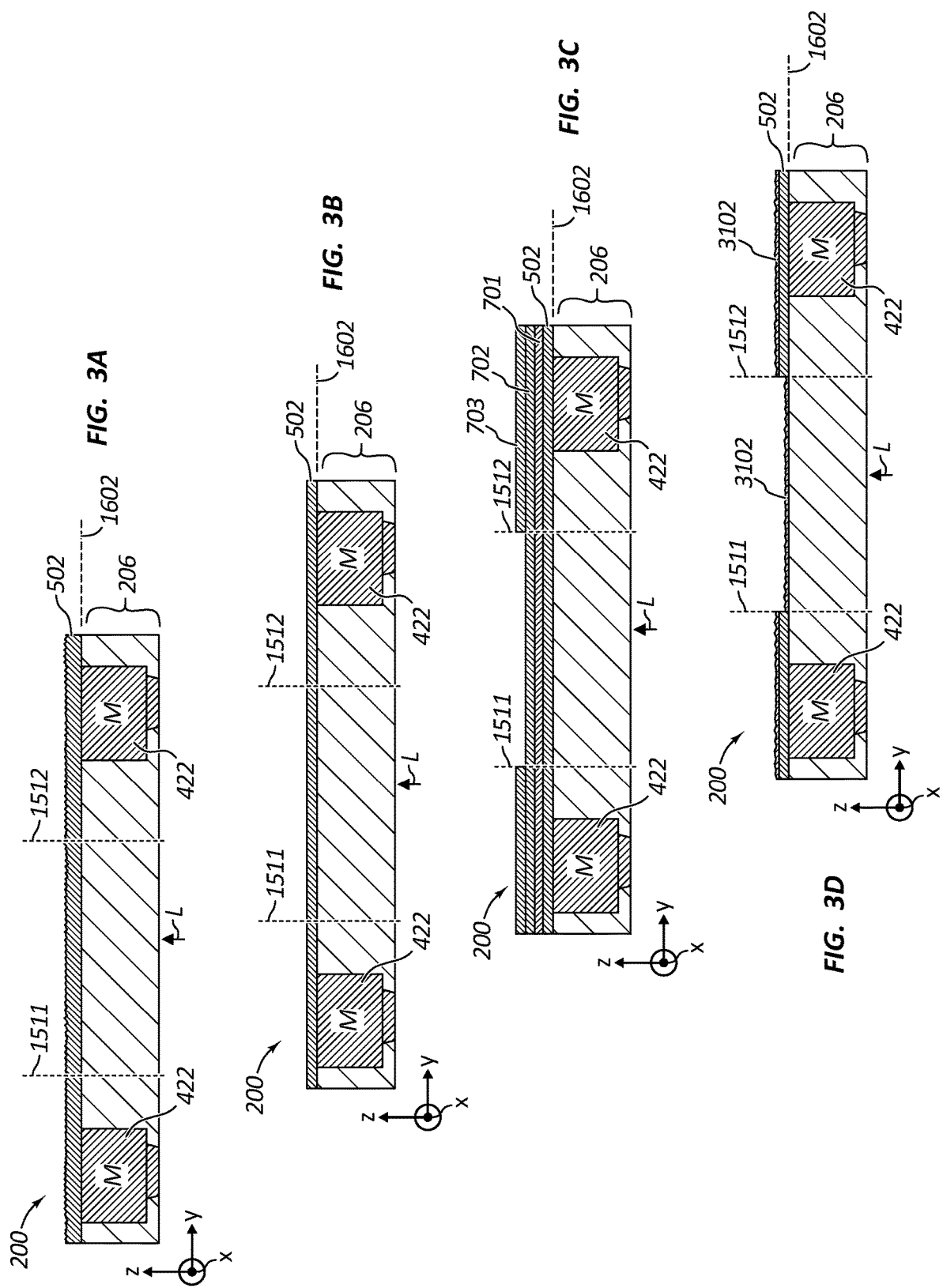

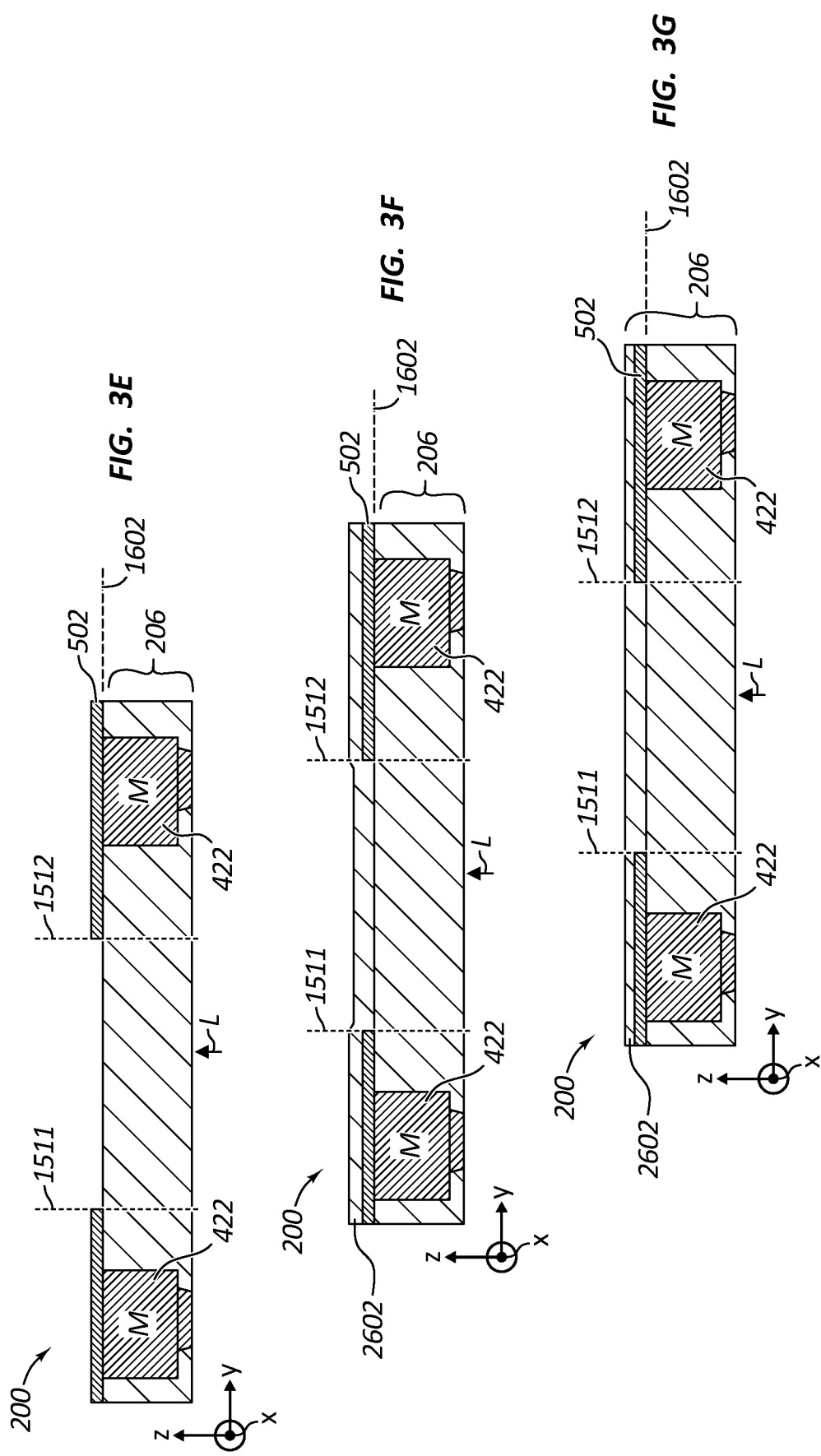

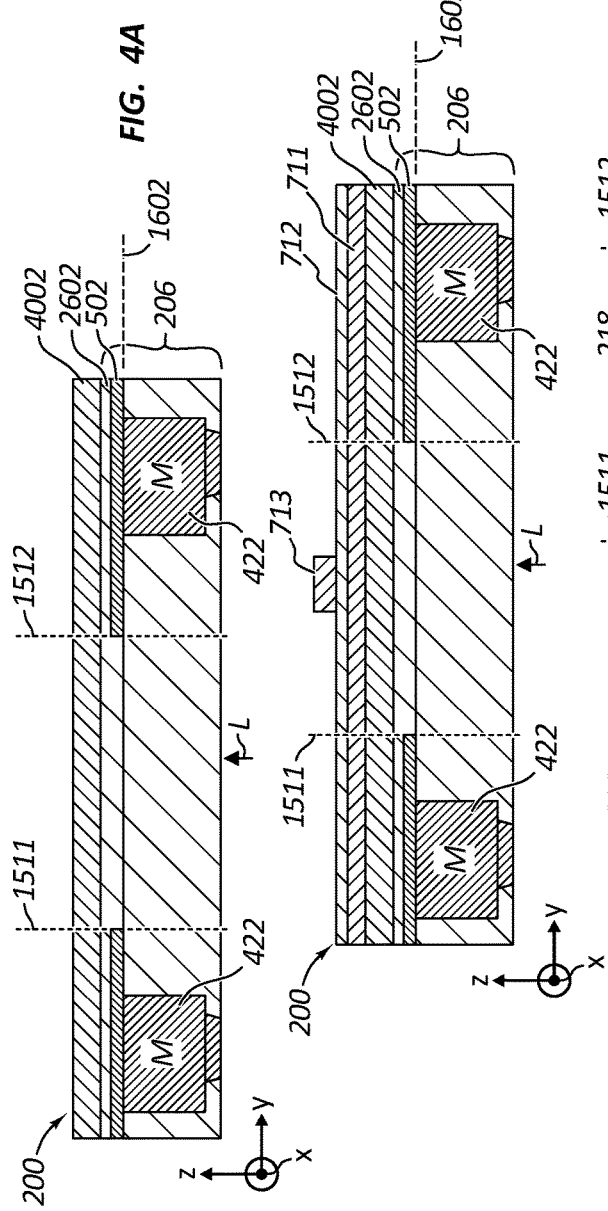

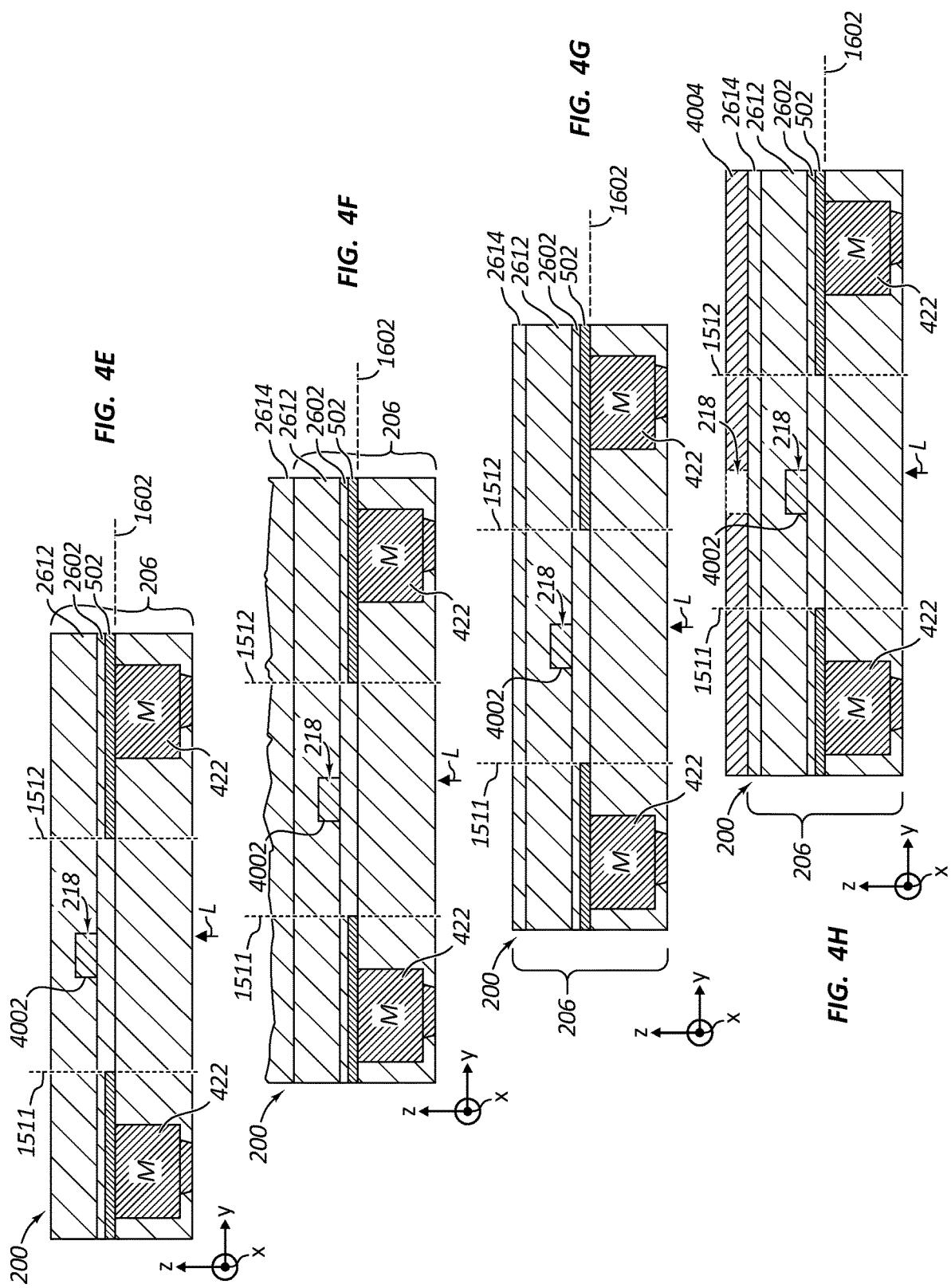

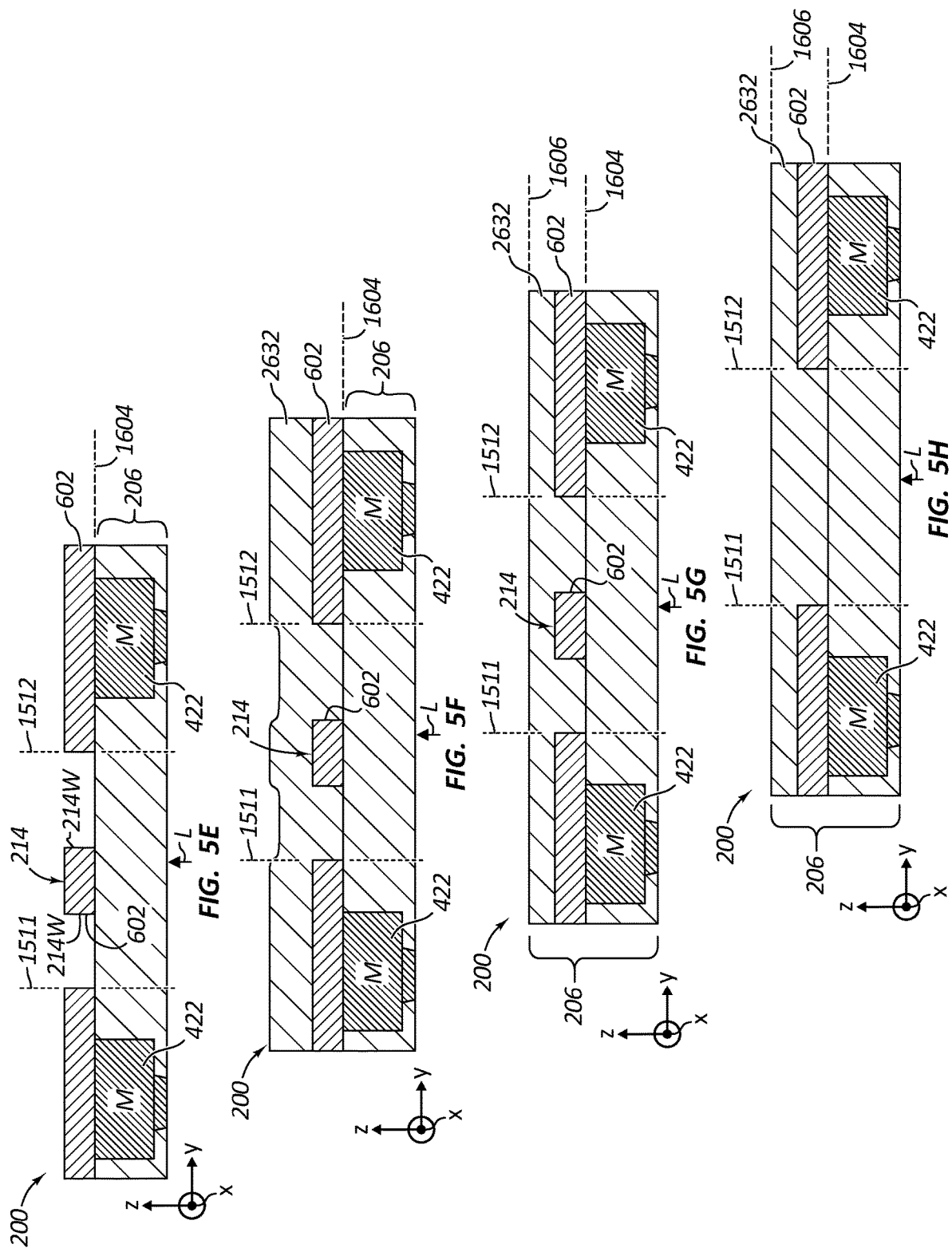

PHOTONICS LIGHT SIGNAL TRANSMISSION

CROSS-REFERENCE TO RELATED APPLICATIONS

This application is a continuation of U.S. patent application Ser. No. 16/998,736 filed Aug. 20, 2020, entitled, "Fabricating Photonics Structure Light Signal Transmission Regions", which is incorporated by reference herein in its entirety, which is a continuation of U.S. patent application Ser. No. 16/372,763 filed Apr. 2, 2019, entitled, "Fabricating Photonics Structure Light Signal Transmission Regions", which is incorporated by reference herein in its entirety, which claims the benefit of priority of U.S. Provisional Application No. 62/653,232 filed Apr. 5, 2018 entitled "Fabricating Photonics Structure Light Signal Transmission Regions" which is incorporated by reference herein in its entirety.

GOVERNMENT RIGHTS STATEMENT

This invention was made with government support under Defense Advanced Research Projects Agency (DARPA) of the United States, under grant contract number HR0011-12-2-0007. The government may have certain rights in the invention.

FIELD

The present disclosure relates to photonics generally and specifically to photonics devices, photonics structures, and/or fabricating of photonics structures.

BACKGROUND

Commercially available photonic integrated circuits are fabricated on wafers, such as bulk silicon or silicon-on-insulator wafers.

In one aspect photonics integrated circuits can include waveguides for transmission of optical signals between different areas of a photonic integrated circuit chip as well as on and off the chip. Commercially available waveguides are of rectangular or ridge geometry and are fabricated in silicon (single or polycrystalline) or silicon nitride.

Commercially available photonics integrated circuits can include photodetectors and other optical components. Photonic integrated circuits rely on the emission, modulation and the detection of light in the communication band (about 1.3 µm to about 1.55 µm). A bandgap absorption edge in germanium is near 1.58 µm. Germanium has been observed to provide sufficient photo-response for optoelectronic applications using 1.3 µm and 1.55 µm carrier wavelengths.

Commercially available photonics integrated circuit chips are available on systems having a photonics integrated circuit chip disposed on a printed circuit board.

BRIEF DESCRIPTION

The shortcomings of the prior art are overcome, and additional advantages are provided, through the provision, in one aspect, of a photonics structure.

There is set forth herein a photonics device. The photonics device can comprise a substrate, a conductive material formation, a dielectric stack, and a barrier layer. The photonics device can transmit a light signal.

There is set forth herein a photonics device, comprising: a substrate; a photonics structure on the substrate, the photonics structure having a light signal transmitting region; a conductive material formation on the substrate, the conductive material formation having an elevation thereof; a dielectric stack on the substrate; a barrier layer having a first portion that extends through the light signal transmitting region of the photonics structure and a second portion formed over the conductive material formation, wherein the first portion further formed over the dielectric stack, the barrier layer further including an exposed portion of the dielectric stack within the light signal transmitting region; and a cladding dielectric material layer over the barrier layer such that a portion of the layer of cladding dielectric material is formed over the exposed portion of the dielectric stack, the cladding dielectric material layer further having a top surface with a horizontal plane.

There is set forth herein a photonics device, comprising: a substrate; a photonics structure on the substrate, the photonics structure having a light signal transmitting region; a conductive material formation on the substrate, the conductive material formation having an elevation thereof; a dielectric stack on the substrate; a barrier layer having a first portion that extends through the light signal transmitting region of the photonics structure and a second portion formed over the conductive material formation, wherein the first portion further formed over the dielectric stack, the barrier layer further including an exposed portion of the dielectric stack within the light signal transmitting region; and a cladding dielectric material layer over the barrier layer such that a portion of the layer of cladding dielectric material is formed over the exposed portion of the dielectric stack, the cladding dielectric material layer further having a top surface with a horizontal plane; and a waveguide material layer on the cladding dielectric material layer, the waveguide material layer patterned to define a waveguide, and the waveguide material layer having a layer of planarized deposited oxide thereover.

There is set forth herein a photonics device, comprising: a substrate; a light signal transmission means for transmitting a light signal, the light signal transmission means located on the substrate; a conductive means for conducting an electrical signal, the conductive means on the substrate; a dielectric stack on the substrate; a barrier layer having a first portion that extends through the light signal transmission means and a second portion formed over the conductive means, wherein the first portion further formed over the dielectric stack, the barrier layer further including an exposed portion of the dielectric stack within the light signal transmission means; and a cladding dielectric material layer over the barrier layer such that a portion of the layer of cladding dielectric material is formed over the exposed portion of the dielectric stack formed within the light signal transmission means.

There is set forth herein depositing a layer formed of barrier material over a conductive material formation of a photonics structure; and removing material of the layer in a light signal transmitting region of the photonics structure. In one embodiment the barrier material can include silicon carbon nitride. In one embodiment the barrier material can include silicon nitride.

There is set forth herein depositing a layer formed of silicon carbon nitride so that the layer formed of silicon carbon nitride includes a first portion extending through a light signal transmitting region of a photonics structure, and further so that the layer formed of silicon carbon nitride includes a second portion formed on a conductive material formation, wherein the first portion extending through the light signal transmitting region is formed on a dielectric stack; removing the first portion of the layer formed of silicon carbon nitride that is formed on the dielectric stack to expose the dielectric stack within the light signal transmitting region; depositing a layer of cladding dielectric material so that a portion of the layer of cladding dielectric material is formed on the layer formed of silicon carbon nitride and portion of the layer of cladding dielectric material is formed on the exposed portion of the dielectric stack formed within the light signal transmitting region; and planarizing the layer of cladding dielectric material so that a top surface of the cladding dielectric material extends in a horizontal plane.

There is set forth herein depositing a layer formed of silicon nitride so that the layer formed of silicon nitride includes a first portion extending through a light signal transmitting region of a photonics structure, and further so that the layer formed of silicon nitride includes a second portion formed on a conductive material formation, wherein the first portion extending through the light signal transmitting region is formed on a dielectric stack; removing material of the first portion of the layer formed of silicon nitride that is formed on the dielectric stack to expose the dielectric stack within the light signal transmitting region; depositing a layer of cladding dielectric material so that a portion of the layer of cladding dielectric material is formed on the layer formed of silicon nitride and portion of the layer of cladding dielectric material is formed on the exposed portion of the dielectric stack formed within the light signal transmitting region; and planarizing the layer of cladding dielectric material so that a top surface of the cladding dielectric material extends in a horizontal plane.

Additional features and advantages are realized through the techniques of the present disclosure.

BRIEF DESCRIPTION OF THE SEVERAL VIEWS OF THE DRAWINGS

One or more aspects of the present disclosure are particularly pointed out and distinctly claimed as examples in the claims at the conclusion of the specification. The foregoing and other objects, features, and advantages of the disclosure are apparent from the following detailed description taken in conjunction with the accompanying drawings in which:

FIGS. 3A-3G are fabrication stage views illustrating the process for removal of silicon carbon nitride from a light signal transmitting region of the photonics structure as shown in FIG. 1 according to one embodiment;

FIGS. 4A-4H are fabrication stage views illustrating a process for fabrication of a photonics device supported by a dielectric layer occupying an area previously occupied by a sacrificial portion of a layer formed of silicon carbon nitride; and FIGS. 5A-5H are fabrication stage views illustrating the process for removal of silicon carbon nitride from a light signal transmitting region of the photonics structure as shown in FIG. 1 according to one embodiment.

DETAILED DESCRIPTION

Aspects of the present disclosure and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the disclosure in detail. It should be understood, however, that the detailed description and the specific examples, while indicating aspects of the disclosure, are given by way of illustration only, and not by way of limitation. Various substitutions, modifications, additions, and/or arrangements, within the spirit and/or scope of the underlying inventive concepts will be apparent to those skilled in the art from this disclosure.

Figure 1:
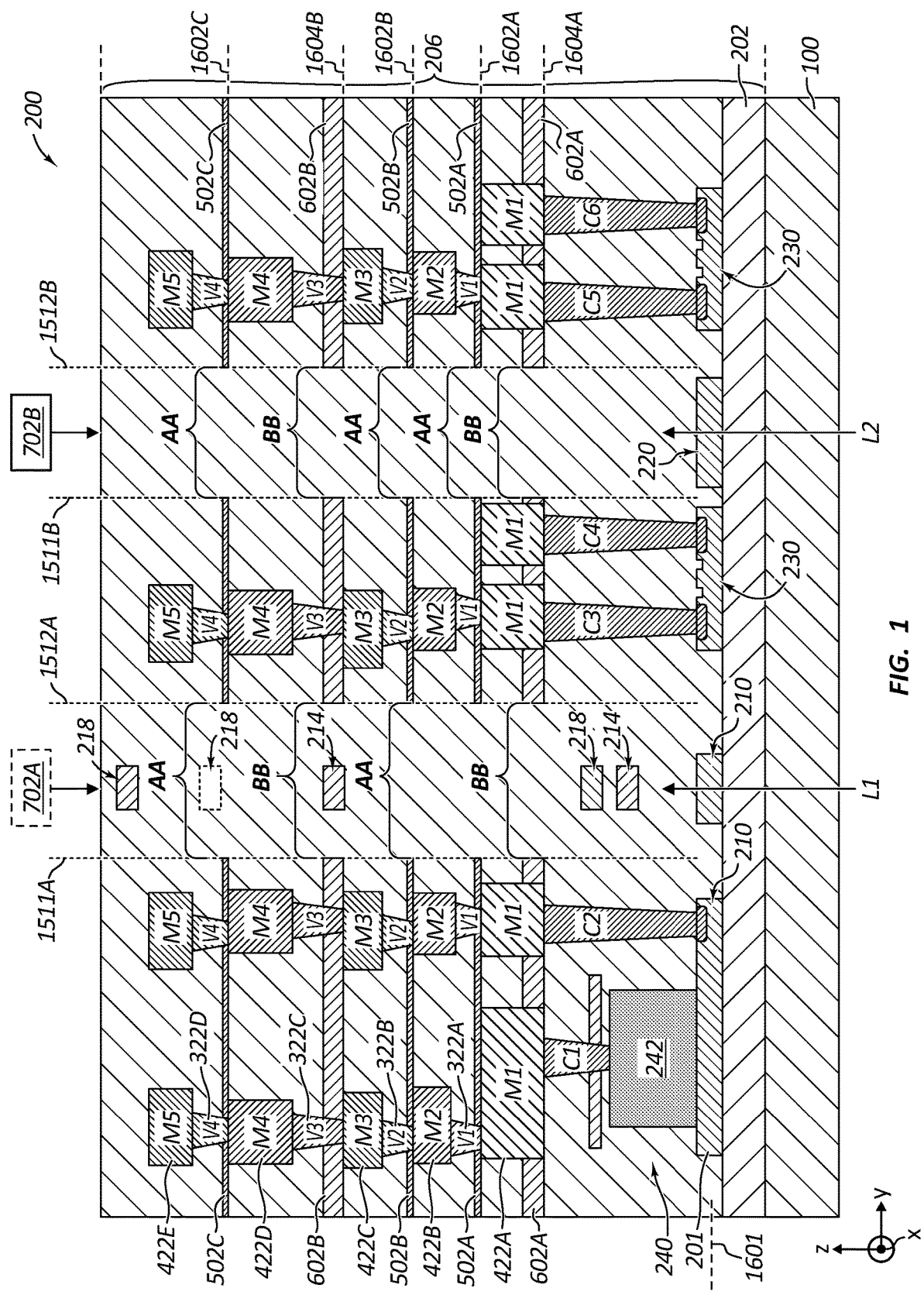
FIG. 1 is a cutaway side view of a photonics structure having one or more photonics devices fabricated within a dielectric stack according to one embodiment.

FIG. 1 illustrates fabrication of photonics structure 200 having a photonics dielectric stack 206 in which there can be fabricated and defined one or more photonics device such as one or more waveguide of waveguides 210, one or more waveguide of waveguides 214, one or more waveguide 218, one or more grating 220, one or more modulator 230, and one or more photodetector 240 having light sensitive material formation 242. A one or more photonics device can in addition or alternatively be provided e.g. by a resonator, a polarizer or another type of photonics device. In the described embodiment, waveguides 210 can represent waveguides formed of single crystalline silicon (Si), waveguides 214 can represent waveguides formed of nitride, e.g. SiN, and waveguides 218 can represent waveguides formed of any generic waveguiding material, e.g. single crystalline silicon, polycrystalline silicon, amorphous silicon, silicon nitride, or silicon oxynitride. Photonics structure 200 can be built using a prefabricated silicon on insulator (SOI) wafer having substrate 100, insulator layer 202 and silicon layer 201. Waveguides 210, grating 220 and modulator 230 can be patterned in silicon layer 201.

Patterned within photonics dielectric stack 206 there can also be contact conductive material formations such as contact conductive material formations C1, C2, C3, C4, C5 and C6, metallization layer 422A defining metallization layer conductive material formations M1, vias layer 322A defining vias layer conductive material formations V1, metallization layer 422B defining metallization layer conductive material formations M2, vias layer 322B defining vias layer conductive material formations V2, metallization layer 422C defining metallization layer conductive material formations M3, vias layer 322C defining vias layer conductive material formations V3, metallization layer 422D defining metallization layer conductive material formations M4, vias layer 322D defining vias layer conductive material formations V4, and metallization layer 422E defining metallization layer conductive material formations M5.

Contact conductive material formations C1, C2, C3, C4, C5, and C6 can be formed generally by depositing one or more dielectric stack layer to at least top elevation of the respective contact conductive material formation C1, C2, C3, C4, C5, and C6 etching to define cavities for receiving conductive material, filling the cavities with conductive material, and then planarizing to the top elevation of the respective contact conductive material formation C1, C2, C3, C4, C5, and C6. Contact conductive material formation C1 can be formed e.g. of aluminum (Al), tungsten (W) or another non-copper conductive material. Contact conductive material formations C2-C6 can be formed e.g. of copper (Cu), aluminum (Al), tungsten (W) or another metal or another conductive material.

Metallization layers 422A, 422B, 422C, 422D, 422E can be formed generally by depositing one or more dielectric stack layer to at least top elevation of the respective metallization layer 422A, 422B, 422C, 422D, 422E, etching to define cavities for receiving conductive material, filling the cavities with conductive material, and then planarizing to the top elevation of the respective metallization layer 422A, 422B, 422C, 422D, 422E. Metallization layers 422A, 422B, 422C, 422D, 422E can also be formed generally by depositing uniform thickness metallization layers, and then masking and etching to remove layer material from unwanted areas. Metallization layers 422A, 422B, 422C, 422D defining metallization layer conductive material formations M1-M4 can be formed of e.g. copper (Cu), aluminum (Al), tungsten (W) or another metal or another conductive material. Metallization layer 422E defining metallization layer formations M5 can be formed of aluminum (Al).

Vias layers 322A, 322B, 322C, 322D can be formed generally by one or more dielectric stack layer to at least a top elevation of the respective vias layer 322A, 322B, 322C, 322D, etching to define cavities for receiving conductive material, filling the cavities with conductive material, and then planarizing to the top elevation of the respective vias layer 322A, 322B, 322C, 322D. Vias layers 322A, 322B, 322C, 322D can also be formed generally by depositing uniform thickness metallization layers, and then masking and etching to remove layer material from areas where the layer material is unwanted. Vias layers 322A, 322B, 322C defining vias layer conductive material formations V1-V3 can be formed e.g. of copper (Cu), aluminum (Al), tungsten (W) or another metal or another conductive material. Vias layer 322D defining vias layer conductive material formations V4 can be formed of aluminum (Al).

Metallization layer 422A, metallization layer 422B, metallization layer 422C, metallization layer 422D, and metallization layer 422E can define horizontally extending wires. Wires defined by metallization layers 422A, 422B, 422C, 422D, 422E can be horizontally extending through areas of photonics dielectric stack 206.

Horizontally extending wires defined by metallization layer 422A can be electrically connected to one or more vertically extending contact conductive material formations C1-C6 and vias V1 defined by vias layer 322A for distribution of one or more of control, logic and/or power signals vertically and horizontally to different areas of photonics dielectric stack 206 having fabricated therein one or more photonics device.

Horizontally extending wires defined by metallization layer 422B can be electrically connected to one or more of vertically extending vias V1 defined by vias layer 322A and/or vertically extending vias V2 defined by vias layer 322B for distribution of one or more of electrical control, logic and/or power signals vertically and horizontally between different areas of photonics dielectric stack 206.

Horizontally extending wires defined by metallization layer 422C can be electrically connected to one or more of vertically extending vias V2 defined by vias layer 322B and/or vertically extending vias V3 defined by vias layer 322C for distribution of one or more of electrical control, logic and/or power signals vertically and horizontally between different areas of photonics dielectric stack 206.

Horizontally extending wires defined by metallization layer 422D can be electrically connected to one or more of vertically extending vias V3 defined by vias layer 322C and/or vertically extending vias V4 defined by vias layer 322D for distribution of one or more of electrical control, logic and/or power signals vertically and horizontally between different areas of photonics dielectric stack 206.

Horizontally extending wires defined by metallization layer 422E can be electrically connected to one or more of vertically extending vias V4 defined by vias layer 322D for distribution of one or more of electrical control, logic and/or power signals vertically and horizontally between different areas of photonics dielectric stack 206.

Photonics structure 200 in one embodiment can be fabricated using various processes including processes for fabricating light signal transmitting regions of photonics structures. Processes for fabrication of photonics structure 200 can include (A) a process for removal of silicon carbon nitride (SiCN) from photonics structure 200 to reduce IR light absorption; and (B) a process for removal of SiN to reduce unwanted light coupling between circuit elements.

Embodiments herein recognize that use of copper (Cu) defining conductive material formations in photonics structure 200 such as contact conductive material formations C2-C6, metallization layer conductive material formations M1-M4, and vias layer conductive materials formations V1-V3, can increase performance of photonics structure 200 based on the low resistivity properties of copper (Cu). Copper can include resistivity of about $1.72 \times 10^{-8}$ Ohm-m at 20° C. Thus, use of copper can significantly increase signal propagation speed. Embodiments herein recognize problems with use of copper, however, including copper migration and corrosion of copper. Copper can migrate into material of a dielectric stack for example. Copper can also readily oxidize and corrode resulting in increased resistivity. Dielectric layers of photonics dielectric stack 206 that are deposited on metallization layers can be selected to function as a barrier to resist migration of conductive material, and to inhibit corrosion attributable to oxidization. In one embodiment SiCN can be selected to form a barrier to resist migration of copper and to inhibit corrosion by oxidization of copper. SiCN has electrical migration and corrosion barrier properties. While migration of copper can be resisted with use of SiCN, embodiments herein recognize that SiCN can exhibit significant light absorption particularly in the IR band.

Embodiments herein further recognize that SiCN can inhibit performance of a photonics system. For example, embodiments herein recognize that where there is a designed photonics signal transmission path in a photonics system, a presence of SiCN can absorb light energy and accordingly can inhibit (e.g. reduce or prevent performance of) transmission of a light signal.

Referring to FIG. 1, photonics structure 200 can include one or more designed light signal transmitting region. For example, there can be a light signal transmitting region L1 at the X dimension depth shown (depth 1502 depicted in FIG. 2) between vertically extending planes 1511A and 1512B. There can be a light signal transmitting region L2 at the depth shown between vertically extending planes 1511A and 1512A. In each light signal transmission region L1 and L2 signal light can be transmitted from a higher elevation to a lower elevation and/or from a lower elevation to a higher elevation. Light signal transmitting region L1 and light signal transmitting region L2 can transmit light signals of photonics structure 200 e.g. upwardly or downwardly, and in one embodiment can transmit signals vertically (about 90-degree angle with respect to a horizontal plane). Light signal transmitting regions of photonics structure can transmit light signals in any direction.

Light signal transmission within light signal transmission region L1 can include light signal transmissions between photonics devices at different elevations, e.g. between two or more waveguides within light signal transmission region L1 at the respective elevations 1602A, 1602B, 1602C, 1604A, 1604B depicted in FIG. 1.

Photonics structure 200 can be configured so that first and second waveguides of waveguides 210, 214, 218 couple light signals therebetween, or alternatively are in optical isolation from one another and do not couple light signals. Coupling between waveguides can be controlled by controlling spacing between waveguides and additional parameters, e.g. controlling spacing so that intended light signal coupling between waveguides occurs or controlling spacing so that waveguides are in optical isolation. Light signal coupling between waveguides can include e.g. evanescent coupling or tap coupling.

Light signal transmission region L1 can include an associated light input device 702A shown in dashed in form in FIG. 1. Light input device 702A can be provided e.g. by a laser light source or a fiber optic cable carrying light. Light signal transmission within light signal transmission region L2 can include light signal transmissions between light input device 702B and a photonics device provided by a grating 220 shown in FIG. 1. Light input device 702B can be provided e.g. by a laser light source or a fiber optic cable carrying light that emits light downwardly through light signal transmission region L2. The photonics device provided by a grating 220 depicted in FIG. 1 can be provided e.g. by a photonics grating that receives signal light emitted by light input device 702B. Photonics structure 200 can have associated light input devices 702A and 702B associated to photonics structure 200 for inputting light generally downwardly e.g. vertically or about vertically. Photonics structure 200 can additionally or alternatively have associated light input devices (e.g. laser light sources or light carrying cables) that input light into photonics structure 200 generally laterally e.g. horizontally or about horizontally.

Figure 2:
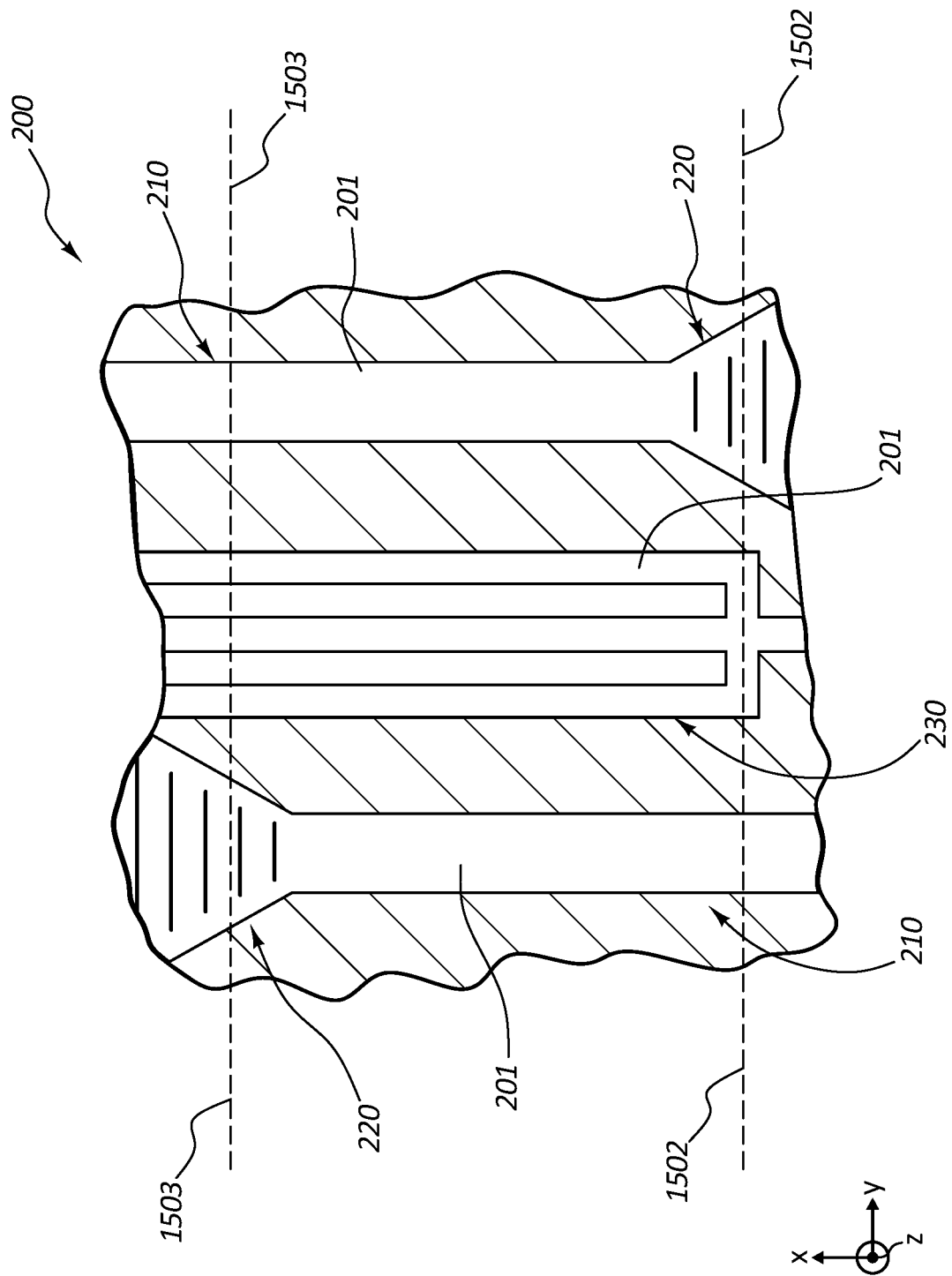
FIG. 2 is a partial top cutaway view of the photonics structure depicted in FIG. 1 taken at elevation 1601 of FIG. 1

A top view cross sectional view of FIG. 1 taken along FIG. 1 elevation 1601 is shown in FIG. 2. In FIG. 2 depth 1502 can illustrate the cut depth of the cross-sectional Z-Y plane cross sectional view shown in FIG. 1 and depth 1503 (FIG. 2) can illustrate a depth into the paper with respect to the view of FIG. 1. Light input device 702B can couple light downwardly to a photonics device depicted in FIG. 1 as being provided by a photonics grating 220 at about X dimension depth 1502 (the cut depicted in FIG. 1). Light input device 702A depicted in dashed form in FIG. 1 can couple light downwardly to the photonics device provided by grating 220 e.g. provided at about the X dimension depth 1503 (FIG. 2). The photonics device provided by grating 220 at depth 1503 (FIG. 2) can be integrally formed with a forwardly extending waveguide 210 as shown (extending out of the paper in FIG. 1) and a photonics device provided by grating 220 at depth 1502 (FIG. 2) can be integrally formed with a waveguide 210 extending into the paper with respect to the cut depth depicted in FIG. 1.

Embodiments herein recognize that the presence of light absorbing materials in the light signal transmitting region L1 between vertically extending plane 1511A and vertically extending plane 1512A and the light signal transmitting region L2 between vertically extending plane 1511B and vertically extending plane 1512B can negatively impact operation of photonics structure 200. Embodiments herein recognize e.g. that a presence of SiCN within light signal transmission region L1 can inhibit light signal transmission for coupling between depicted photonics structures fabricated within dielectric stack 206 within light signal transmitting region L1. Embodiments herein recognize e.g. that a presence of SiCN within light signal transmission region L2 can inhibit light signal transmission between depicted light input device 702B and the photonics device provided by grating 220 fabricated within dielectric stack 206 within light signal transmitting region L2. Embodiments herein recognize that waveguides have transmission modes wherein light signals propagating through a waveguide travel partially externally to an external wall of the waveguide. Such waveguide external light can undesirably be absorbed by formations of SiCN.

Referring to areas AA of FIG. 1 and FIGS. 3A-3G aspects of (A) a process for removal of SiCN from light signal transmitting regions to reduce IR light absorption are set forth herein. Referring again to FIG. 1, layers 502A, 502B, and 502C can be formed as barrier layers to inhibit migration and corrosion of conductive material formations formed of copper (Cu) or other conductive material capable of migration and/or corrosion. Conductive material formations formed of copper (Cu) can include contact conductive material formations C2-C6, metallization layer conductive material formations M1-M4 defined by metallization layers 422A-422D, and/or vias layer conductive material formations V1-V3 defined by vias layers 322A-322C.

Referring to FIGS. 3A-3G, there are shown a series of fabrication stage views illustrating fabrication of areas AA of photonics structure 200, depicted in FIG. 1. FIG. 3A illustrates photonics structure 200 in an intermediary stage of fabrication after depositing of layer 502 provided by SiCN.

In the stage views depicted in FIGS. 3A-3G, and 4A-4H layer 502 generically represents any of layers 502A-502C, depicted in FIG. 1, layer 422 generically represents any of layers 422A-422B, or 422D of FIG. 1, pairs of vertically extending planes 1511 and 1512 generically represents any of pairs of vertically extending planes 1511A and 1512A, or vertically extending planes 1511B and 1512B of FIG. 1, metallization layer formation M generically represents any of metallization layer formations M1, M2, or M4 depicted in FIG. 1, and light signal transmitting region L generically represents any of light signal transmitting regions L1 or L2 depicted in FIG. 1. Layer 422 in the stage views depicted in FIGS. 3A-3G, and 4A-4H can alternatively represent a vias layer 322A-322C, another metallization layer of metallization layers 422A-422E or a layer defining contact conductive material formations C1-C6 as set forth in FIG. 1.

As shown in the stage view depicted in FIG. 3A, depositing of SiCN can include depositing a portion of layer 502 on a top surface of dielectric stack 206 and depositing a portion of layer 502 on one or more section of layer 422, which layer 422 can be formed of copper (Cu). Layer 422 can be formed of copper (Cu) e.g. where layer 422 defines a conductive material formation other than contact conductive material formation C1, a vias layer other than a vias layer defining conductive material formations V4, or a metallization layer other than a metallization layer defining conductive material formations M5. The portion of layer 502 deposited on dielectric stack 206 can extend through a light signal transmitting region defined between vertically extending plane 1511 and vertically extending plane 1512.

Prior to the depositing of layer 502 formed of SiCN, the photonics structure 200 depicted in the stage view of FIG. 3A can be subject to CMP planarization to reduce an elevation of photonics structure 200 to elevation 1602, representative generically of any of the elevations 1602A-1602C depicted in FIG. 1. The performance of CMP planarization to reduce an elevation of photonics structure 200 to elevation 1602 can be accompanied by CMP polishing to polish photonics structure 200 at elevation 1602. CMP planarization can result in photonics structure 200 defining planar horizontal surface at elevation 1602 prior to deposition of layer 502 formed of silicon carbon nitride (SiCN) so that deposition of layer 502 can include deposition of layer 502 on a planar surface.

CMP polishing can result in photonics structure 200 featuring an atomically smooth surface at elevation 1602 prior to the deposition of layer 502. Providing the surface of photonics structure 200 to be atomically smooth at elevation 1602 can facilitate performance of light signal transmitting region L, e.g. by the reduction of unwanted light scattering.

For depositing of layer 502 formed of SiCN partially on metallization layer formation M, plasma enhanced chemical vapor deposition (PECVD) can be employed. PECVD can be performed with use of reduced thermal budget, e.g. in a temperature range of from about 300° C. to about 500° C.

Still referring to the stage view of FIG. 3A, layer 502 on completion of depositing of layer 502 can exhibit a roughened top surface as depicted in the stage view of FIG. 3A.

FIG. 3B illustrates photonics structure 200 as depicted in the stage view of FIG. 3A after subjecting a top surface of layer 502 to processing for smoothing of a top surface of layer 502. Photonics structure 200 as depicted in the intermediary stage view of FIG. 3B can be subject to CMP planarization to planarize the top surface of layer 502 so that the top surface of layer 502 is planar and extends in a horizontal plane. The CMP planarization can be accompanied by CMP polishing so that the top surface of layer 502 depicted in the intermediary stage view of FIG. 3B is an atomically smooth surface.

Layer 502 can provide a barrier to electrical migration and corrosion with respect to layer 422 formed of conductive material, e.g. copper (Cu) or another conductive material susceptible to electrical migration and corrosion. Layer 422 can be formed of copper (Cu) e.g. where layer 422 defines a conductive material formation other than contact conductive material formation C1, a vias layer other than a vias layer defining conductive material formations V4, or a metallization layer other than a metallization layer defining conductive material formations M5. Embodiments herein recognize that SiCN features high-quality electrical migration and corrosion barrier properties. In one embodiment, layer 502 which can be formed as an electrical migration and corrosion barrier layer may be subject to processing so that layer 502 has high quality photonics properties, so that a portion of layer 502 can facilitate light signal transmission through a light signal transmitting region e.g. through an elevation of layer 502 within light signal transmission region L. Layer 502 can provide electrical insulation and spacing functionality irrespective of whether the conductive material defining layer 422 is susceptible to electrical migration or corrosion. For example, in some embodiments layer 422 as depicted in the stage views of FIGS. 5A-5H can define contact conductive material formation C1, which can be formed of aluminum or another non-copper conductive material. In some embodiments, conductive material formations C2-C6 and/or metallization layers 422A-422D and/or vias layers 322A-322C can be formed of conductive material other than copper. As noted metallization layer 422E and vias layer 322D can be formed of aluminum (Al).

FIG. 3C is an intermediary fabrication stage view of photonics structure 200 as depicted in the stage view of FIG. 3B after depositing of a photolithography stack for use in etching of layer 502 in light signal transmitting region L between vertically extending plane 1511 and vertically extending plane 1512.

The photolithography stack depicted in the intermediary fabrication stage view of FIG. 3C can be an organic photolithography stack. The photolithography stack depicted in the intermediary fabrication stage view of FIG. 3C can be a multilayer organic photolithography stack and can include layers 701, 702, and 703. Layer 701 can be an organic planarization layer (OPL), layer 702 can be a silicon-containing anti-reflective coating (SIARC) layer, and layer 703 can be a resist layer. Referring to the intermediary fabrication stage view of FIG. 3C, the intermediary fabrication stage view of FIG. 3C depicts photonics structure 200 subsequent to patterning of layer 703 to define a pattern for etching away of a portion of layer 502 within light signal transmitting region L.

Patterning of layer 703 can be performed with use of a photolithography mask disposed in a photolithography tool (not shown) that is activated to expose areas of layer 703 not protected by the photolithography mask within the photolithography tool.

FIG. 3D illustrating photonics structure 200 as shown in FIG. 3C in an intermediary stage of fabrication after performance of etching using the pattern of layer 703 to remove material of layer 502 in light signal transmitting region L between vertically extending plane 1511 and vertically extending plane 1512.

For performance of etching depicted in the intermediary fabrication stage view of FIG. 3C, reactive ion etching (RIE) can be used. RIE depicted in the intermediary stage view of FIG. 3D can include use of an etching process that is selective to oxide so that material of layer 502 provided by SiCN can be removed without removal of material of dielectric stack 206. On completion of RIE as depicted in the intermediary fabrication stage view of FIG. 3D, etching products 3102 can remain on photonics structure 200. Etching products 3102 can include, e.g. residual amounts of the photolithography stack including layers 701, 702, 703 and residual amounts of SiCN, which can be located on dielectric stack 206 depicted in light signal transmitting region L as shown in the intermediary fabrication stage view of FIG. 3C.

FIG. 3E depicts photonics structure 200 as shown in FIG. 3D, in an intermediary stage of fabrication subsequent to cleaning to remove etching products 3102, depicted in FIG. 3D. Cleaning as depicted in FIG. 3E can include temperature controlled cleaning to avoid damage to surfaces of photonics structure 200 such as a top surface of dielectric stack 206. For cleaning of RIE products 3102 a mixture that can be used that includes ammonia hydroxide ($NH_4OH$) and peroxide ($H_2O_2$). Temperature controlled cleaning can include performing of cleaning at temperatures of about 25° C. or less.

FIG. 3F illustrates photonics structure 200 as depicted in FIG. 3E in an intermediary stage view of fabrication, subsequent to depositing of layer 2602 which can be formed of cladding dielectric material e.g. oxide such as silicon dioxide ($SiO_2$). As seen in the stage view depicted in FIG. 3F, layer 2602 may have multiple elevations, e.g. a lower elevation within the light signal transmitting region L between vertically extending plane 1511 and vertically extending plane 1512 and a higher elevation to the left of vertically extending plane 1511 and to the right of vertically extending plane 1512. The differing elevations can result from the removal of portion of layer 502 in the stage depicted in FIG. 3C.

FIG. 3G illustrates photonics structure 200 as depicted in FIG. 3F in an intermediary stage of fabrication subsequent to further processing to planarize and to polish layer 2602. Depicted in the intermediary fabrication stage view of FIG. 3G, layer 2602 which can be formed of cladding dielectric material e.g. oxide such as SiO2 can be subject to CMP planarization to reduce an elevation of layer 2602 and to planarize layer 2602 so that a top surface of layer 2602 is planar and extends in a horizontal plane. The CMP planarization to planarize layer 2602 can be accompanied by CMP polishing to polish a top surface of layer 2602, so that a top surface of layer 2602 is atomically smooth.

Example conditions for the process (A) described in connection with FIGS. 3A-3G according to one embodiment are set forth in Table A.

TABLE A

| Layer thickness ranges of layers 502, 2602 | SiCN thickness range from about 20 nm to about 200 nm, pteos (SiO2) thickness oxide range is from about 50 nm to about 2,000 nm. |
|---|---|
| Deposition of layer 502 | Pressure enhanced chemical vapor deposition (PECVD) (temperature controlled, e.g. using temperatures of between about 300° C. and about 500° C.). |
| Patterning of Layer 502 | Resist over SIARC (43%) over OPL |
| Etching of layer 502 | Etch SiCN selective to oxide with key removal over photonics devices |
| Cleaning of layer 502 | Cleaning with NH4OH and H2O2 ratios tuned for cleaning efficiency that are under (<25° C. temps), cleaning residue, SiCN and oxide surface so oxide surface remains smooth and defect free for further oxide processing |
| Depositing of layer 2602 | Dielectric cladding provided by oxide for Z height control to locate any oxide to oxide interface away from an SiN waveguide. PECVD can be used. (temperature controlled, e.g. using temperatures of between about 300° C. and about 500° C.). |
| Planarizing and polishing of layer 2602 | Atomic level smoothness (<2A RMS) for improved fabrication of additional photonic devices e.g. formed of SiN or for oxide capping layers. |

Providing layer 2602 to be atomically smooth can facilitate light signal transmissions through layer 2602. Providing processing of layer 2602 so that a top surface of layer 2602 is planarized and atomically smooth can provide processing planarity for subsequent fabrication including for fabrication of photonics devices. In one embodiment, layer 2602 can support fabrication of a photonic device formed over layer 2602.

FIGS. 4A-4G are fabrication stage views illustrating fabrication of a photonics device provided by a waveguide 218 over layer 2602. Referring again to FIG. 1, there is illustrated waveguide 218 in dashed line form formed on a dielectric layer that is formed on layer 502C of SiCN. However, it is understood that waveguide 218 shown in dashed form in FIG. 1 can additionally or alternatively be formed on respective dielectric layers formed on layer 502A and/or layer 502B.

FIG. 4A illustrates photonics structure 200 as depicted in FIG. 3G in an intermediary stage of fabrication after depositing of layer 4002, formed of waveguiding material. Waveguiding material defining layer 4002 can be provided, e.g. by single crystalline silicon, polycrystalline silicon, amorphous silicon, silicon nitride, or silicon oxynitride. Depositing of layer 4002 formed of waveguiding material can include use of PECVD at a reduced thermal budget, e.g. at a processing temperature of from about 300° C. to about 500° C. As depicted in the intermediary fabrication stage view of FIG. 4A, processing of layer 4002 can include depositing layer 4002 on layer 2602 and then subjecting layer 4002 to additional processing after deposition of layer 4002. The additional processing can include subjecting layer 4002 to CMP planarization to planarize layer 4002 so that a top surface of layer 4002 is planar and extends in a horizontal plane. The subjecting of layer 4002 to CMP planarization can include subjecting layer 4002 to CMP polishing so that a top surface of layer 4002 is atomically smooth.

FIG. 4B illustrates photonics structure 200 as depicted in FIG. 4A in an intermediary stage of fabrication subsequent to forming of a photolithography stack on layer 4002 formed of waveguiding material. The photolithography stack depicted in FIG. 4B can include layer 711 formed of OPL, layer 712 formed of SIARC, and layer 713 formed of resist.

FIG. 4C illustrates photonics structure 200 as illustrated in FIG. 4B in an intermediary stage of fabrication subsequent to etching away of material of layer 4002 formed of waveguiding material using the photolithography stack depicted in FIG. 4B to define waveguide 218. Waveguide 218 can be formed of any suitable waveguiding material, e.g. monocrystalline silicon, single crystalline silicon, polycrystalline silicon, amorphous silicon, silicon nitride, or silicon oxynitride.

Regarding waveguide 218 shown in an intermediary stage of fabrication in FIG. 4C, waveguide 218 can include vertically extending sidewalls 218 W. Anisotropic etching can be used for the formation of vertically extending sidewalls 218 W. Etching to define waveguide 218 so that waveguide 218 features vertically extending sidewalls 218 W can improve coupling between waveguide 218 and photonics devices external to waveguide 218.

Vertically extending sidewalls 218 W can be fabricated in one embodiment, using reactive ion etching (RIE). RIE can be performed or define vertically extending sidewalls 218 W. RIE can include a series of etching and depositing steps. RIE for etching of layer 4002 to define vertically extending sidewalls 218 W can include use of a Bosch type RIE, and in one embodiment an amount of material of layer 4002 can be removed according to an iterative etch step followed by an iterative deposit step. In each iterative deposit step, material can be deposited on a defined sidewall 218 W. Deposited material deposited on sidewall 218 W can include a polymer material. Following each iterative depositing step, there can be performed a further etching to etch away another amount of material of layer 4002 formed of waveguiding material.

Vertically extending sidewalls 218 W which can be formed, e.g. using a Bosch process can be subject to line edge roughness treatment. In the case where waveguide 218 is formed of nitride. Line edge roughness treatment can include application of a steam or high pressure oxidation at moderate to high temperatures to convert a few outermost nanometers of the silicon nitride (SiCN) defining waveguide 218 to form silicon dioxide (SiO$_2$). The formed SiO2 can then be subject to removal by immersion in an aqueous hydrofluoric solution to remove the formed SiO2 in order to improve line edge roughness of the defined waveguide 218. In the case waveguide 218 is formed of silicon line edge roughness treatments can include H2 annealing using reduced pressure chemical vapor deposition (RPCVD) or rapid thermal chemical vapor deposition (RTCVD) processing or depositing epitaxial silicon on the surfaces to reduce line edge roughness.

FIG. 4D illustrates photonics structure 200 as depicted in FIG. 4C in an intermediary stage of fabrication subsequent to depositing of layer 2612 formed of dielectric material, e.g. SiO2. A PECVD process can be used for deposition of layer 2602 at a reduced thermal temperature budget, e.g. using a temperature in the range of about 300° C. to about 500° C. In one embodiment, depositing of layer 2612 can include depositing non-conformal material over defined waveguide 218 patterned as described in connection with FIG. 4C.

Depositing of layer 2612 can include use of PECVD with high aspect ratio processing (HARP). Non-conformality may be achieved using plasma enhancements during a deposition phase with conditions tuned to enhance deposition rates on horizontal surfaces while suppressing deposition rates on vertical surfaces (e.g. on step edges defined with use of a Bosch process). Thus, voids and other defects resulting from pinch off of a cladding layer can be avoided and detrimental effects of the same on photonics signal transmission can be minimized. In one embodiment, layer 2612 can be formed of non-conformal oxide material, e.g. non-conformal SiO2. Use of non-conformal oxide material for layer 2612 can reduce in incidents of voids and other defects in dielectric stack 206 that surrounds waveguide 218. A non-conformal oxide material can be a material that is adapted to a deposit at a higher rate, on horizontal surfaces while exhibiting a suppressed sidewall deposition rate. In one embodiment, of a method for providing non-conformal oxide material a deposition of oxide material can be plasma enhanced. It can be envisioned (but is not depicted) that with the use of conformal material for use of layer 2612 pinch off can occur when layer 2612 is deposited over high aspect ratio features and accordingly can result in an introduction of voids with oxide surrounding waveguides such as waveguides 218.

FIG. 4E illustrates photonics structure 200 as depicted in FIG. 4D, subsequent to further processing of layer 2612 formed of a cladding dielectric material e.g. oxide such as SiO2 to define a cladding layer. Referring to FIG. 4E a top surface of layer 2612 can be subject to CMP planarization to reduce an elevation of layer 2612 and to provide processing so that a top surface of layer 2612 is planar and extends in a horizontal plane to provide processing planarity for subsequent layers. CMP planarization can be accompanied by CMP polishing so that a top surface of layer 2612 is atomically smooth.

FIG. 4F illustrates photonics structure 200 as depicted in FIG. 4E in an intermediary stage of fabrication subsequent to depositing of layer 2614. Layer 2614 can be provided by capping dielectric material e.g. oxide such as SiO2. Depositing of layer 2614 can include use of a saline based PECVD at a reduced thermal budget, e.g. at a temperature of between about 300° C. and about 500° C. Layer 2614 can be regarded as a capping layer.

FIG. 4G illustrates photonics structure 200 as depicted in FIG. 4F in an intermediary stage of fabrication subsequent to further processing of layer 2614. Further processing of layer 2614 depicted in FIG. 4G can include subjecting layer 2614 to CMP planarization to provide a top surface of layer 2614 so that a top surface of layer 2614 is planar and extends in a horizontal plane. CMP planarization of layer 2614 can be accompanied by CMP polishing so that a top surface of layer 2614 is atomically smooth.

Photonics devices of photonics structure 200 can transmit or receive light signals transmitted through elevation 1602 within light signal transmitting region L with material of layer 502 removed within light signal transmitting region. Light signal coupling can be between any two waveguides within light signal transmitting region including a waveguide 218 of FIGS. 4B-4H if fabricated. Light signal coupling can be between a light input device 702B and a the photonics device provided by grating 220 in light signal transmitting region L2.

FIG. 4H illustrates photonics structure 200 as depicted in FIG. 4G in an intermediary stage of fabrication subsequent to deposition of layer 4004 and further processing of layer 4004. Referring to FIG. 4H, layer 4004 can be a waveguiding layer provided, e.g. by single crystalline silicon, polycrystalline silicon, silicon nitride, or silicon oxynitride, deposited on a top surface of layer 2614 using e.g. PECVD and a reduced thermal budget, e.g. in a temperature range of from about 300° C. to about 500° C. As depicted in FIG. 4H, layer 4004 can be subject to further processing to define waveguide 218 depicted in dashed form of FIG. 4H. Patterning to define waveguide 218 depicted in dashed form in FIG. 4H can be performed according to the processing to define waveguide 218 (not dashed) as depicted in FIG. 4C, subsequent to patterning to define waveguide 218 depicted in dashed form of FIG. 4H. The defined waveguide 218 depicted in dashed form can be subject to further processing as depicted with reference to waveguide 218 (not dashed) described in reference to FIGS. 4D-4G to surround the additional waveguide 218 defined by layer 4004 with a cladding dielectric material e.g. oxide and then forming on the cladding dielectric material oxide a capping dielectric material, e.g. oxide. Use of plural dielectric e.g. oxide layers such as may be provided by layer 2612 and 2614 between waveguides 218 (dashed and not dashed) as depicted in FIG. 4H provides for controlled spacing distance between waveguides, useful for achieving design tolerances in accordance with the specified design. For example, spacing distances can be readily achieved so that different waveguides can couple light signals therebetween when light coupling is desired and can be prevented from coupling light signals therebetween when photonics isolation is specified in a design specification for photonics structure 200.

Aspects of a process (B) for removal of silicon nitride (SiN) are now described. In one aspect, now described in reference to areas BB of FIG. 1 and fabrication stage view of FIGS. 5A-5G. Referring again to FIG. 1, layers 602A and 602B can be formed as barrier layers to inhibit migration and corrosion of conductive material formations formed of copper (Cu) or other conductive material capable of migration and/or corrosion. Conductive material formation formed of copper can include contact conductive material formations C2-C6, metallization layer conductive material formations M1-M4 defined by metallization layers 422A-422D, and/or vias layer conductive material formations V1-V3 defined by vias layers 322A-322C.

Embodiments herein recognize that silicon nitride (SiN) has significant electrical migration and corrosion barrier properties. SiN can inhibit the electrical migration of copper and corrosion of copper. Embodiments herein further recognize that use of silicon nitride in photonics structure 200 can present risk and that due to the index of refraction of silicon nitride, silicon nitride material can undesirably couple light signals transmitted within light signal transmitting region L1 between vertically extending plane 1511 and vertically extending plane 1512 wherein light signals can be desirably coupled between photonics devices e.g. including waveguides and light signals transmitted within light signal transmitting region L2 between vertically extending plane 1511B and vertically extending plane 1512B wherein a light signal can be introduced to photonics structure 200 by light input device 702B.

The process (B) for removal of silicon nitride can result in the removal of silicon nitride from light signal transmitting region L1 or L2. Referring to details of a process (B) for removal of silicon nitride from a light signal transmitting region there are provided fabrication stage views depicted in FIGS. 5A-5H.

In the fabrication stage views depicted in FIGS. 5A-5H, layer 602 generically represents any of layers 602A or 602B, depicted in FIG. 1, layer 422 of FIGS. 5A-5G generically represents any of layer 422C or the layer(s) forming contact conductive material formations C2, C3, C4, and C5 of FIG. 1, vertically extending planes 1511 and 1512 generically represents any of pairs of vertically extending planes such as vertically extending planes 1511A and 1512A, or vertically extending planes 1511B and 1512B of FIG. 1, conductive material formation M of FIGS. 5A-5G generically represents any of metallization layer formation M3 or conductive material formations C2, C3, C4, and C5 depicted in FIG. 1, and light signal transmitting region L generically represents any of light signal transmitting regions L1 or L2 depicted in FIG. 1. Layer 422 in the stage views depicted in FIGS. 5A-5H can alternatively represent a vias layer 322A-322C, another metallization layer of metallization layers 422A-422E or a layer defining one or more other contact conductive material formation of contact conductive material formations C1-C6 as set forth in FIG. 1.

Figure 5A:
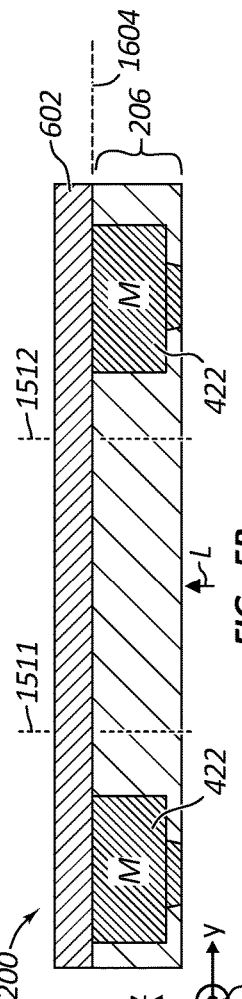

Referring to the intermediary stage view of FIG. 5A, layer 602 can be deposited on dielectric stack 206 and layer 422 as depicted in FIG. 5A with a portion of layer 602 being deposited on a top surface of dielectric stack 206 within light signal transmitting region L defined between vertically extending plane 1511 and vertically extending plane 1512 and a portion of layer 602 being deposited on layer 422. The portion of layer 602 deposited on layer 422 can include a first section located to the left of vertically extending plane 1511 and a second section located to the right of vertically extending plane 1512.

Referring to the depositing in the fabrication stage view of FIG. 5A, a portion of layer 602 can be deposited on a top surface of dielectric stack 206 in the fabrication stage view depicted, which dielectric stack 206 can be provided, e.g. in one embodiment by a plurality of layers of oxide such as SiO2.

Prior to the depositing of layer 602, photonics structure 200 as depicted in FIG. 5A can be subject to CMP planarization to reduce an elevation of the surface defined by layer 422 formed of conductive material and dielectric stack 206 to reduce the elevation of such defined surface and to planarize the defined surface so that the defined surface extends in a horizontal plane at elevation 1604. The CMP planarization can be accompanied by CMP polishing so that the defined planar surface extending horizontally at elevation 1604 is atomically smooth.

For the depositing of layer 602 onto the planar surface defined by layer plasma enhanced chemical vapor deposition (PECVD) can be employed. PECVD can be performed at the use of reduced thermal budget, e.g. at temperatures in a temperature range of between about 300° C. and about 500° C.

Layer 602 can provide a barrier to electrical migration and corrosion with respect to layer 422 formed of conductive material, e.g. copper (Cu) or another conductive material susceptible to electrical migration and corrosion. Layer 422 can be formed of copper (Cu) e.g. where layer 422 defines a conductive material formation other than contact conductive material formation C1, a vias layer other than conductive material formation V4, or a metallization layer other than conductive material formation M5. Embodiments herein recognize that SiN features high-quality electrical migration and corrosion barrier properties. In one embodiment, layer 602 which can be formed as an electrical migration and corrosion barrier layer may be subject to processing so that layer 602 has high quality photonics properties, so that a portion of layer 602 can be removed to facilitate light signal transmission through a light signal transmitting region, e.g. through an elevation of layer 602 within light signal transmission region L and/or can be patterned to define a waveguide for transmission of a light signal. Layer 602 can provide electrical insulation and spacing functionality irrespective of whether the conductive material defining layer 422 is susceptible to electrical migration or corrosion. For example, in some embodiments layer 422 as depicted in the stage views of FIGS. 5A-5H can define contact conductive material formation C1, which can be formed of aluminum or another non-copper conductive material. In some embodiments, conductive material formations C2-C6 and/or metallization layers 422A-422D and/or vias layers 322A-322C can be formed of conductive material other than copper. As noted metallization layer 422E and vias layer 322D can be formed of aluminum (Al).

On completion of the depositing stage as depicted in FIG. 5A, layer 602 can be deposited. However, on the depositing of layer 602 the top surface of layer 602 can be roughened, depicted in FIG. 5A.

Figure 5B:
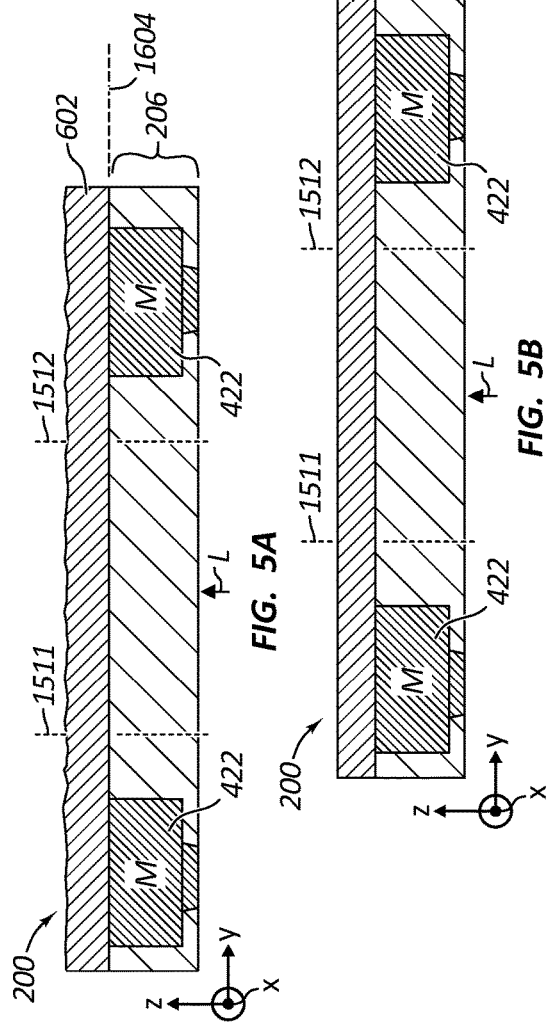

Now referring to the intermediary stage view of FIG. 5B layer 602 (shown in roughened form in FIG. 5A) can be subject to processing for planarizing and polishing of layer 602, namely a top surface of layer 602. In one embodiment, layer 602 as depicted in FIG. 5B can be subject to planarization, e.g. by CMP planarization so that a top surface of layer 602 is planarized and extends in a horizontal plane parallel to the X-Y horizontal plane defined by the depicted reference coordinate system shown in connection with FIG. 5B. The CMP planarization can be accompanied by CMP polishing so that a top planar surface of layer 602 is atomically smooth.

Figure 5C:
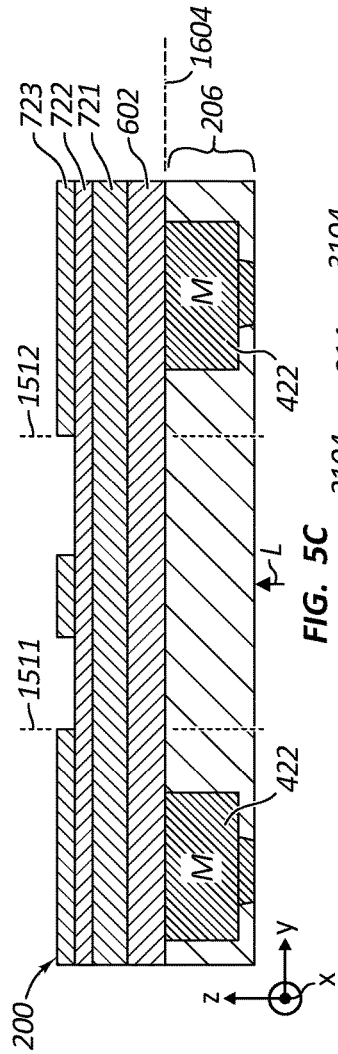
Figure 5D:
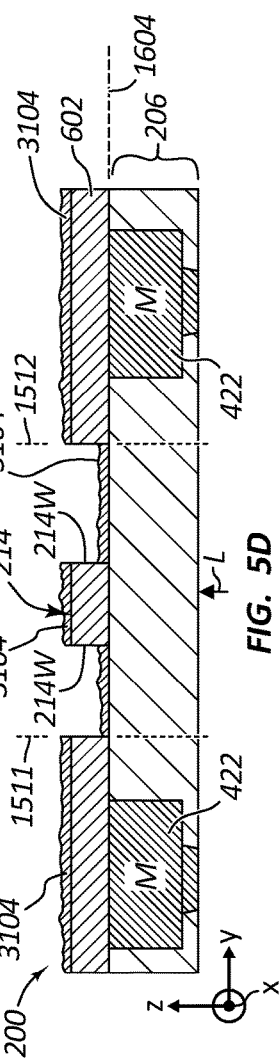

Referring to the stage views of FIGS. 5C-5E layer 602 provided by SiN can be subject to processing for removal of at least a portion of layer 602 from a light signal transmitting region L between vertically extending plane 1511 and vertically extending plane 1512. Regarding the depositing of layer 602, deposition pressure, power, and flow rate can be controlled to provide layer 602 so that layer 602 features an index of refraction of about 2.0.

For patterning of layer 602 in one embodiment, a multilayer organic photolithography stack can be deposited over layer 602. A multilayer photolithography stack as shown in FIG. 5C can include layer 721, layer 722, and layer 723. Layer 721 can be provided by an organic planarization layer (OPL). Layer 721 can facilitate protection of layer 602. Layer 722 can be provided by a silicon-containing anti-reflective coating (SIARC) layer, and layer 723 can be provided by a resist layer. Layer 722 can include about 43% silicon in one embodiment.

Referring further to the patterning stack depicted in the intermediary fabrication stage view of FIG. 5C, the stage view of FIG. 5C depicts photonics structure 200 subsequent to patterning of layer 723 formed of resist. Patterning of layer 723 can include exposing layer 723 (not shown) having a mask disposed therein including an inverse of the pattern of layer 723.

FIG. 5D illustrates photonics structure 200 after performance of processing described with reference to the intermediary fabrication stage view of FIG. 5C. FIG. 5D illustrates photonics structure 200 as depicted in FIG. 5C after performance of etching to remove material of layer 602. Etching can be selective to dielectric material e.g. oxide defining dielectric stack 206 so that material of layer 602 is removed without removal of material of dielectric stack 206. Etching can be performed according to the pattern of the multilayer photolithography stack having layers 721, 722, and 723 so that etching selectively removes material of layer 602 without removal of material of dielectric stack 206. Etching can include use of reactive ion etching (RIE).

Vertically extending sidewalls 214 W of defined waveguide 214 depicted in the intermediary stage of fabrication of FIG. 5D can be fabricated in one embodiment, using reactive ion etching (RIE). RIE can be performed or define vertically extending sidewalls 214 W. RIE can include a series of etching and depositing steps. RIE for etching of layer 4002 to define vertically extending sidewalls 214 W can include use of a Bosch type RIE, and in one embodiment an amount of material of layer 4002 can be removed according to an iterative etch step followed by an iterative deposit step. In each iterative deposit step, material can be deposited on a defined sidewall 214 W. Deposited material deposited on sidewall 214 W can include a polymer material. Following each iterative depositing step, there can be performed a further etching to etch away another amount of material of layer 602 formed of waveguiding material provided by SiN in the embodiment described.

Vertically extending sidewalls 214 W which can be formed, e.g. using a Bosch process can be subject to line edge roughness treatment. In a case where waveguide 214 is formed of nitride as depicted in FIG. 5D line edge roughness treatment can include application of a steam or high pressure oxidation at moderate to high temperatures to convert a few outermost nanometers of the silicon nitride (SiN) defining waveguide 214 to form silicon dioxide ($SiO_2$). The formed SiO2 can then be subject to removal by immersion in an aqueous hydrofluoric solution to remove the formed SiO2 in order to improve line edge roughness of the defined waveguide 214.

On the completion of performance of etching as depicted in FIG. 5D etching products 3104 can remain on a top surface of the photonics structure 200 depicted in the intermediary stage of fabrication depicted in FIG. 5. Etching products 3104 can include e.g. portions of the photolithography stack having layers 721, 722, and 723 and residual amounts of SiN from layer 602.

FIG. 5E illustrates photonics structure 200 as depicted in FIG. 5D in an intermediary stage of fabrication subsequent to processing to remove etching products 3104. Cleaning etching products 3104 can include e.g. use of a mixture of ammonia hydroxide ($NH_4OH$) and peroxide ($H_2O_2$). Cleaning etching products 3104 can include use a low temperature cleaning process, e.g. performed at a temperature of about 25° C. or less.

FIG. 5F illustrates the photonics structure 200 as depicted in FIG. 5D in an intermediary stage of fabrication after depositing of layer 2632 which can be formed of cladding dielectric material e.g. oxide such as silicon dioxide ($SiO_2$). Depositing of layer 2632 can include use of PECVD with high aspect ratio processing (HARP). Non-conformality may be achieved using plasma enhancements during a deposition phase with conditions tuned to enhance deposition rates on horizontal surfaces while suppressing deposition rates on vertical surfaces (e.g. on step edges defined with use of a Bosch process). Thus, voids and other defects resulting from pinch off of a cladding layer can be avoided and detrimental effects of the same on photonics signal transmission can be minimized. In one embodiment, layer 2632 can be formed of non-conformal oxide material, e.g. SiO2. Use of non-conformal oxide material for layer 2632 can reduce in incidents of voids and other defects in dielectric stack 206 that surrounds waveguide 214. A non-conformal oxide material can be a material that is adapted to a deposit at a higher rate, on horizontal surfaces while exhibiting a suppressed sidewall deposition rate. In one embodiment, of a method for providing non-conformal oxide material a deposition of oxide material can be plasma enhanced. It can be envisioned (but is not depicted) that with the use of conformal material for use of layer 2632 pinch off can occur when layer 2632 is deposited over high aspect ratio features and accordingly can result in an introduction of voids with oxide surrounding waveguides such as waveguides 214. Processing conditions can be tuned to that layer 2632 features an index of refraction of about 1.45.

Layer 2632 can define a cladding dielectric layer. Layer 2632 can be deposited using a high aspect ratio PECVD process as set forth herein. In a stage view depicted in FIG. 5F it is seen that layer 2632 on the deposition thereof can have multiple elevations, i.e. dips in the areas above which layer 602 has been etched.

FIG. 5G depicts photonics structure 200 as shown in FIG. 5F in an intermediary stage of fabrication after planarizing of layer 2632. For planarizing of layer 2632, a chemical/mechanical planarization (CMP planarization) process can be used. On the performance of planarization, an elevation of a top surface of layer 2632 can be reduced and planarized to extend in a horizontal plane parallel with the reference coordinate system X-Y plane at elevation 1606. CMP planarization can be accompanied by CMP polishing so that a top surface of layer 2632 is atomically smooth.

Patterning of layer 602 can include patterning to define waveguide 214 formed of silicon nitride (SiN) within the light signal transmitting region L defined between vertically extending plane 1511 and vertically extending plane 1512. Thus, by way of patterning of layer 602 which can be a single layer in one embodiment there can be defined multiple formations that provide different functions. A first formation defined by patterning of layer 602 can be a migration and corrosion barrier formation, e.g. as provided by portions of layer 602 formed on layer 422 formed of conductive material. A second formation defined by patterning of layer 602 can be a photonics device formation, e.g. as provided by waveguide 214 depicted in FIGS. 5D-5G.

According to the fabrication stages depicted in the stage views of FIGS. 5A-5G, layer 602 formed of silicon nitride (SiN) can be deposited and then patterned to define both of a formation provided by a barrier formation for inhibiting conductive material e.g. copper (Cu) migration and conductive material corrosion and a formation provided by a waveguide 214.

Process (B) which can include patterning of a silicon nitride (SiN) layer to remove material of layer 602 from a light signal transmitting region L can be provided in the manner depicted with reference to the stage views of FIGS. 5A-5G except that processing can be absent of processing to define waveguide 214 in the light signal transmitting region L defined between vertically extending plane 1511 and vertically extending plane 1512. In accordance with the processing described with reference to the stage views of FIGS. 3A-3H, processing of layer 602 can be performed so that material of layer 602 provided by SiN can be entirely removed in the light signal transmitting region L defined between vertically extending plane 1511 and vertically extending plane 1512.

Referring again to FIG. 1 in one embodiment, patterning of layer 602 can be performed in one embodiment so that waveguide 214 is defined within light transmitting region L1 defined at about the depth 1502 (FIG. 2) and further so that waveguide 214 is not defined within light transmitting region L2 defined at about the same depth 1502 (FIG. 2) depicted in FIG. 1. Further referring to FIG. 1, layer 602A formed of SiN can patterned for defining waveguide 214 within light signal transmitting region L1 and layer 602B formed of SiN may not be patterned for defining waveguide 214 within light signal transmitting region L1. In one embodiment neither of layer 602A nor layer 602B may be patterned for formation of waveguide 214 within light signal transmitting region L1.

Providing such alternative processing can include changing the pattern of the photolithography stack including layers 721, 722, 723 at different region in the X-Y plane so that the portion of layer 723 formed of resist in the light signal transmitting region L between vertically extending plane 1511 and vertically extending plane 1512 is removed in a manner so that the formation provided by waveguide 214 is not defined by the etching of layer 602 depicted in the stage view of FIG. 5D. The resulting structure resulting from the described alternative processing is shown in FIG. 5H.

Removal of material of layer 602 from the light signal transmitting region L defined between vertically extending plane 1511 and vertically extending plane 1512 as depicted in the stage views of FIGS. 5A-5H can avoid unwanted light coupling between transmitting light rays and silicon nitride formations whether or not a photonics device defined by layer 602 is defined by the patterning. Removal of material of layer 602 from the light signal transmitting region L defined between vertically extending plane 1511 and vertically extending plane 1512 as depicted in the stage views of FIGS. 5A-5H can facilitate light signal coupling between photonics devices defined above or below layer 602 within light transmitting region L (as depicted with reference to light transmitting region L1 of FIG. 1). Removal of material of layer 602 from the light signal transmitting region L defined between vertically extending plane 1511 and vertically extending plane 1512 as depicted in the stage views of FIGS. 5A-5H can facilitate light signal coupling between a light input device and a photonics device fabricated within dielectric stack (as depicted with reference to light transmitting region L2 of FIG. 1).

Photonics devices of photonics structure 200 can transmit or receive light signals transmitted through elevation 1604 within light signal transmitting region L with material of layer 602 removed within light signal transmitting region L. Light signal coupling can be between any two waveguides 210, 214, 218 on opposite sides of elevation 1604 within light signal transmitting region L1. Additionally or alternatively, light signal coupling can include light signal coupling of any waveguide 210, 214, 218 within light signal transmitting region L1 and waveguide 214 (FIG. 5D-5G) fabricated at elevation 1604 if fabricated. Light signal coupling can be between a light input device 702B and a photonics device provided by a grating 220 in light signal transmitting region L2.

Example conditions for the process (B) described in connection with FIGS. 5A-5H are set forth in Table B according to one embodiment.

TABLE B

Example process condition for process (B)

| Parameter(s) | Condition(s) |
| --- | --- |
| Layer thickness ranges of layers 602, 2632 | SiN thickness range from about 20 nm to about 200 nm, pteos (SiO2) oxide thickness range is from about 50 nm to about 2,000 nm. |
| Deposition of layer 602 | PECVD at from about 300° C. to about 500° C. Pressure enhanced chemical vapor deposition (temperature controlled, e.g. using temperatures of between about 300° C. and about 500° C.). |

TABLE B-continued

Example process condition for process (B)

| Parameter(s) | Condition(s) |
| --- | --- |
| Patterning of Layer 602 | Resist over Siarc (43%) over OPL. |
| Etching of layer 602 | Etch SiN selective to oxide with key removal over photonic devices. |
| Cleaning of layer 602 (etching products) | Gentle cleaning with NH4OH & H2O2. Ratios tuned for cleaning efficiency that are under (<25° C. temperatures). Cleaning residue, SiN and oxide surface so oxide surface remains atomically smooth and defect free for further photonics device or oxide processing. |
| Depositing of layer 2632 | Oxide cladding for Z height control to push any oxide to oxide interface away from the SiN waveguide. PECVD HARP may be used. (temperature controlled, e.g. using temperatures of between about 300° C. and about 500° C.). |
| Planarizing of layer 2632 | CMP planarizing and CMP polishing may be used. Atomic level smoothness (<2A RMS) on oxide can facilitate additional photonic elements like SiN or SiO2 cladding. |

Waveguides as set forth herein such as waveguides 210, 214, and/or 218 within light sensitive region L1 as shown in FIG. 1, FIG. 4B-4H, or FIG. 5D-5H can have respective light transmission axes running in parallel with the X axis of the reference coordinate system shown.

Atomically smooth surfaces set forth herein in various embodiments can refer to surfaces having smoothness ratings of about <5A RMS in one embodiment. Atomically smooth surfaces set forth herein in various embodiments can refer to surfaces having smoothness ratings of about <4A RMS in one embodiment. Atomically smooth surfaces set forth herein in various embodiments can refer to surfaces having smoothness ratings of about <3A RMS in one embodiment. Atomically smooth surfaces set forth herein in various embodiments can refer to surfaces having smoothness ratings of about ≤2A RMS in one embodiment.

Referring again to FIG. 1, fabricating of photonics structure 200 can further include etching of dielectric stack 206 to define trenches exposing top surfaces of metallization layer conductive material formations M5 and in some embodiments fabricating of further features within such trenches further adapting photonics structure 200 for electrical and/or mechanical connection to one or more structure external to photonics structure 200.

The terminology used herein is for the purpose of describing particular embodiments only and is not intended to be limiting. The term "on" in one embodiment can refer to a relationship where an element is "directly on" a specified element without intervening elements between the element and the specified element. As used herein, the singular forms "a," "an," and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises," "has," "includes," or "contains" one or more steps or elements possesses those one or more steps or elements, but is not limited to possessing only those one or more steps or elements. Likewise, a step of a method or an element of a device that "comprises," "has," "includes," or "contains" one or more features possesses those one or more features, but is not limited to possessing only those one or more features. Forms of the term "defined by" encompass relationships where an element is partially defined by as well relationships where an element is entirely defined by. Numerical identifiers herein, e.g. "first" and "second" are arbitrary terms to designate different elements without designating an ordering of elements. Furthermore, a system method or apparatus that is configured in a certain way is configured in at least that way, but may also be configured in ways that are not listed. Furthermore, a system method or apparatus set forth as having a certain number of elements can be practiced with less than or greater than the certain number of elements.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A photonics device, comprising:
   a substrate;
   a photonics structure on the substrate, the photonics structure having a light signal transmitting region;
   a conductive material formation on the substrate, the conductive material formation having an elevation thereof;
   a dielectric stack on the substrate;
   a barrier layer having a first portion that extends through the light signal transmitting region of the photonics structure and a second portion formed over the conductive material formation, wherein the first portion further formed over the dielectric stack, the barrier layer further including an exposed portion of the dielectric stack within the light signal transmitting region; and
   a cladding dielectric material layer over the barrier layer such that a portion of the layer of cladding dielectric material is formed over the exposed portion of the dielectric stack, the cladding dielectric material layer further having a top surface with a horizontal plane.

2. The device of claim 1, wherein:
   the photonics structure further having a planar top surface thereof that is partially defined by the dielectric stack and partially defined by the conductive material formation; and
   the barrier layer is formed over the planar top surface of the photonics structure.

3. The device of claim 1, wherein:
   the light signal transmitting region of the photonics structure is defined between a first vertically extending plane and a spaced apart second vertically extending plane; and
   the barrier layer includes an elevation thereof, and the first portion of the barrier layer facilitates transmitting of a light signal within the light signal transmitting region through the elevation.

4. The device of claim 1, further comprising a second conductive material formation being spaced apart from the conductive material formation and being at an elevation in common with the elevation of the conductive material formation, and wherein the barrier layer further includes a third portion formed on the second conductive material formation.

5. The device of claim 1, wherein the conductive material formation is a metallization layer formed of copper.

6. The device of claim 1, wherein the dielectric stack further includes a photonics device configured to transmit or receive a light signal.

7. The device of claim 1, further comprising a photonics structure on the cladding dielectric material layer.

8. A photonics device, comprising:
   a substrate;
   a photonics structure on the substrate, the photonics structure having a light signal transmitting region;
   a conductive material formation on the substrate, the conductive material formation having an elevation thereof;
   a dielectric stack on the substrate;
   a barrier layer having a first portion that extends through the light signal transmitting region of the photonics structure and a second portion formed over the conductive material formation, wherein the first portion further formed over the dielectric stack, the barrier layer further including an exposed portion of the dielectric stack within the light signal transmitting region;
   a cladding dielectric material layer over the barrier layer such that a portion of the layer of cladding dielectric material is formed over the exposed portion of the dielectric stack, the cladding dielectric material layer further having a top surface with a horizontal plane; and
   a waveguide material layer on the cladding dielectric material layer, the waveguide material layer patterned to define a waveguide, and the waveguide material layer having a layer of planarized deposited oxide thereover.

9. The device of claim 8, wherein the photonics structure includes a planar top surface such that the planar top surface is partially defined by the dielectric stack and partially defined by the conductive material formation.

10. The device of claim 8, wherein the light signal transmitting region of the photonics structure is defined between a first vertically extending plane and a spaced apart second vertically extending plane.

11. The device of claim 8, further including a second conductive material formation on the substrate, and wherein the barrier layer further includes a third portion formed on the second conductive material formation.

12. The device of claim 8, wherein the conductive material formation is a metallization layer.

13. The device of claim 8, further comprising a photonics device within the dielectric stack, the photonics device configured to transmit or receive a light signal.

14. The device of claim 8, wherein:

the photonics structure further having a planar top surface thereof that is partially defined by the dielectric stack and partially defined by the conductive material formation; and the barrier layer is formed over the planar top surface of the photonics structure.

15. The device of claim 8, wherein:

the light signal transmitting region of the photonics structure is defined between a first vertically extending plane and a spaced apart second vertically extending plane; and the barrier layer includes an elevation thereof, and the first portion of the barrier layer facilitates transmitting of a light signal within the light signal transmitting region through the elevation.

16. The device of claim 8, wherein the barrier layer further includes a third portion formed on a second conductive material formation, the second conductive material formation being spaced apart from the conductive material formation and being at an elevation in common with the elevation of the conductive material formation.

17. The device of claim 8, further comprising a photonics structure on the cladding dielectric material layer.

18. A photonics device, comprising:

a substrate;

a light signal transmission means for transmitting a light signal, the light signal transmission means located on the substrate;

a conductive means for conducting an electrical signal, the conductive means on the substrate;

a dielectric stack on the substrate;

a barrier layer having a first portion that extends through the light signal transmission means and a second portion formed over the conductive means, wherein the first portion further formed over the dielectric stack, the barrier layer further including an exposed portion of the dielectric stack within the light signal transmission means; and a cladding dielectric material layer over the barrier layer such that a portion of the layer of cladding dielectric material is formed over the exposed portion of the dielectric stack formed within the light signal transmission means.

19. The device of claim 18, further including a waveguide means for defining a waveguide, the waveguide means on the cladding dielectric material layer.

20. The device of claim 18, wherein the dielectric stack further includes a signaling means for transmitting or receiving a light signal.

* * * * *